US008094109B2

(12) United States Patent
Ishii et al.

(10) Patent No.: US 8,094,109 B2
(45) Date of Patent: Jan. 10, 2012

(54) DATA DRIVER WITH MULTILEVEL VOLTAGE GENERATING CIRCUIT, AND LIQUID CRYSTAL DISPLAY APPARATUS INCLUDING LAYOUT PATTERN OF RESISTOR STRING OF THE MULTILEVEL GENERATING CIRCUIT

(75) Inventors: Junichirou Ishii, Kanagawa (JP); Hiroshi Tsuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 805 days.

(21) Appl. No.: 11/979,351

(22) Filed: Nov. 1, 2007

(65) Prior Publication Data

US 2008/0122776 A1 May 29, 2008

(30) Foreign Application Priority Data

Nov. 2, 2006 (JP) ................................ 2006-298551
Oct. 30, 2007 (JP) ................................ 2007-281525

(51) Int. Cl.
*G09G 3/36* (2006.01)
*G09G 5/10* (2006.01)
*H03M 1/78* (2006.01)

(52) U.S. Cl. ........................................ 345/89; 341/154

(58) Field of Classification Search .................... 345/89, 345/690; 341/144, 145, 154
See application file for complete search history.

(56) References Cited

U.S. PATENT DOCUMENTS

| | | | | |
|---|---|---|---|---|
| 5,854,627 | A * | 12/1998 | Kurihara et al. | 345/89 |
| 6,356,252 | B2 * | 3/2002 | Park | 345/87 |
| 6,529,152 | B1 * | 3/2003 | Piasecki et al. | 341/154 |
| 6,556,182 | B1 * | 4/2003 | Goto et al. | 345/98 |
| 7,038,646 | B2 * | 5/2006 | Fallot-Burghardt et al. | 345/89 |
| 2005/0012700 | A1 * | 1/2005 | Hara | 345/89 |
| 2005/0140534 | A1 * | 6/2005 | Nishi et al. | 345/92 |

FOREIGN PATENT DOCUMENTS

| | | |
|---|---|---|
| CN | 1573425 (A) | 2/2005 |
| JP | 8-213912 | 8/1996 |
| JP | 2000-208703 | 7/2000 |

OTHER PUBLICATIONS

Chinese Office Action dated Mar. 8, 2011, with English translation.

* cited by examiner

*Primary Examiner* — Chanh Nguyen
*Assistant Examiner* — Adam J Snyder
(74) *Attorney, Agent, or Firm* — McGinn Intellectual Property Law Group, PLLC

(57) ABSTRACT

A multilevel voltage generating circuit includes first and second input nodes provided on a first resistance element and supplied with first and second reference voltages. A current substantially flows in a first specific area for a line between the first and second input nodes based on a difference between the first and second reference voltages. A first group of output nodes are provided for the first resistance element to output a portion of a plurality of level voltages. A first one of the first group of output nodes for one of the plurality of level voltages which is closest to the first reference voltage is provided outside the first specific area. The first output node, the first input node, and the second input node, are arranged on a line on the first resistance element in this order.

25 Claims, 17 Drawing Sheets

DATA DRIVER WITH MULTILEVEL VOLTAGE GENERATING CIRCUIT, AND LIQUID CRYSTAL DISPLAY APPARATUS INCLUDING LAYOUT PATTERN OF RESISTOR STRING OF THE MULTILEVEL GENERATING CIRCUIT

BACKGROUND OF THE INVENTION

1. Field of the Invention

The present invention relates to a multilevel voltage generating circuit, a data driver using it, and a liquid crystal display apparatus with the data driver, and more specifically, to a layout pattern of a resistor string of the multilevel voltage generating circuit. The Japanese Patent Application Nos. 2006-298551 and 2007-281525 also relate to a multilevel voltage generating circuit, a data driver using it, and a liquid crystal display apparatus with the data driver. The disclosures of the Japanese Patent Application Nos. 2006-298551 and 2007-281525 are incorporated herein by reference.

2. Description of the Related Art

A resistor string has a plurality of resistors connected with one another through a plurality of division electrodes, divides reference voltages, and outputs a plurality of divided voltages (level voltages) from the plurality of division electrodes. As one example of the resistor string, a resistor string described in Japanese Laid Open Patent Application (JP-A-Heisei 8-213912: related art 1) will be described. In the resistor string described in the related art 1, a single resistance element is provided with contacts and electrodes both arranged in a same interval, each of which outputs a divided voltage. FIG. 1 is a plan view showing a layout pattern of the resistor string described in the related art 1.

Referring to FIG. 1, a resistor string 50 according to the related art 1 will be described. A resistor string 50 is a single resistance element provided with (N+1) contacts 54-0 to 54-N in a same interval. The resistor string 50 divides a voltage difference between reference voltages $VG_0$ and $VG_N$ supplied to the contacts 54-0 and 54-N, and outputs the divided voltages $V_0$ to $V_N$ through the contacts 54-0 to 54-N. Specifically, a wiring 51 to which the reference voltage $VG_0$ is supplied is connected to the contact 54-0, and a wiring 52 to which the reference voltage $VG_N$ is supplied is connected to the contact 54-N. Wirings 53-1 to 53-(N-1) are connected to respective contacts 54-1 to 54-(N-1). In such a configuration, the voltage difference between the two reference voltages $VG_0$ and $VG_N$ is divided by resistors R between these contacts (between dividing electrodes), and the voltages thus obtained are supplied to the nodes 56-1 to 56-(N-1) as the divided voltages $V_1$ to $V_{N-1}$. Moreover, the reference voltages $VG_0$ and $VG_N$ are supplied to the nodes 56-0 and 56-N as the divided voltages $V_0$ and $V_N$ through the wirings 51 and 52, respectively.

In recent years, high-accuracy voltage division is demanded, and a technique of improving an accuracy of division resistors is required. For this reason, in order to improve the accuracy of division resistors, Japanese Laid Open Patent Application (JP-P2000-208703A: related art 2) describes a resistor string obtained by connecting a plurality of resistance elements, not the single resistance element, through dividing electrodes. Furthermore, the related art 2 describes a technique of raising the accuracy of divided voltages by manufacturing a pattern by which division electrodes are defined to be a low-resistance element and thereby avoiding variation in resistance in a contact (hereinafter to be referred to as a contact resistance).

On the other hand, in order to reduce display unevenness of a display apparatus such as a liquid crystal display apparatus, high-accuracy gradation voltages are required. Especially, required is a technique of reducing an error between gradation voltages generated by a gradation voltage generating circuit and a gamma curve of desired gradation voltages.

However, in the resistor string in the related arts, differences in resistance among division electrodes that contribute to voltage division (hereinafter to be referred to as a division resistor) are produced due to contact resistances of the contacts into which reference voltages are supplied. For this reason, when the resistor string in the related art is used for the gradation voltage generating circuit, it is difficult to obtain gradation voltages corresponding to a desired gamma curve because an accuracy of the gradation voltages becomes low. Hereinafter, referring to FIGS. 1 and 2, the error of divided voltages (gradation voltages) from the resistor string in the related art will be described.

FIG. 2 is an equivalent circuit of a resistor string 50 shown in FIG. 1. Referring to FIG. 1, in a steady state, a static current I by the reference voltages flows through a path from the wiring 51 to the wiring 52 though the contacts 54-0 to 54-N. For this reason, as shown in FIG. 2, contact resistances $r_{con0}$ and $r_{conN}$ due to the contacts 54-0 and 54-N will be formed on a current path. When not taking into consideration the contact resistances $r_{con0}$ and $r_{conN}$, the reference voltages are divided only by the resistors R, and the generated divided voltages $V_0$ to $V_N$ are outputted with desired values (ideal values), respectively. However, while the actual divided voltages $V_1$ to $V_{N-1}$ are affected by voltage drops by the contact resistances $r_{con0}$ and $r_{conN}$, the voltages $VG_0$ and $VG_N$ are outputted as the gradation voltages $V_0$ and $V_N$ as they are. For this reason, in the resistor string in the related art, relative errors among the divided voltages $V_0$ to $V_N$ will become large. Moreover, since there is a possibility that these contact resistances $r_{con0}$ to $r_{conN}$ may take different values for every product and for every contact due to a variation at the time of manufacture, the gradation voltage as designed may not be obtained even if a design is made with allowance of the contact resistance, thereby deteriorating a display characteristic. Furthermore, if a selection reference is made severer in order to avoid this problem, the yield of the product may be lowered.

The above-mentioned problems occur similarly in the resistor string described in the related art 2 and in the resistor string made up of a plurality of resistance elements connected together. Especially, in the resistor string formed by connecting the plurality of resistance elements, each contact resistance gives rise to a difference due to manufacturing variation of the contact for connecting the resistance element, and a relative error of each gradation voltage will increase further.

SUMMARY

In a first embodiment of the present invention, a multilevel voltage generating circuit includes first and second input nodes provided on a first resistance element and supplied with first and second reference voltages. A current substantially flows in a first specific area for a line between the first and second input nodes based on a difference between the first and second reference voltages. A first group of output nodes are provided for the first resistance element to output a portion of a plurality of level voltages. A first one of the first group of output nodes for one of the plurality of level voltages which is closest to the first reference voltage is provided outside the first specific area, and a second one of the first group of output nodes for one of the plurality of level voltages which is closest to the second reference voltage is provided outside the first specific area. The first output node, the first input node, the second input node, the second output node are arranged on a line on the first resistance element in this order.

In a second embodiment of the present invention, a data driver includes a multilevel voltage generating circuit; and a decoder configured to select one of a plurality of level voltages based on an input digital data; and an amplifier configured to amplify the selected level voltage to output to one of data lines. The multilevel voltage generating circuit includes first and second input nodes provided on a first resistance element and supplied with first and second reference voltages. A current substantially flows in a first specific area for a line between the first and second input nodes based on a difference between the first and second reference voltages. A first group of output nodes are provided for the first resistance element to output a portion of a plurality of level voltages. A first one of the first group of output nodes for one of the plurality of level voltages which is closest to the first reference voltage is provided outside the first specific area, and a second one of the first group of output nodes for one of the plurality of level voltages which is closest to the second reference voltage is provided outside the first specific area. The first output node, the first input node, the second input node, the second output node are arranged on a line on the first resistance element in this order.

In a third embodiment of the present invention, a liquid crystal display apparatus includes a data driver; a display panel which has pixels connected with one of scanning lines and the data line; and a gate driver configured to drive the scanning lines. The data driver includes a multilevel voltage generating circuit; and a decoder configured to select one of a plurality of level voltages based on an input digital data; and an amplifier configured to amplify the selected level voltage to output to one of data lines.

According to the multilevel voltage generating circuit of the present invention, relative errors in a plurality of output voltages can be suppressed.

Moreover, according to a data driver and a liquid crystal display apparatus in the present invention using the multilevel voltage generating circuit as a gradation voltage generating circuit, display unevenness can be reduced.

Furthermore, the yield of the multilevel voltage generating circuit, the data driver using this, and the liquid crystal display apparatus can be improved.

BRIEF DESCRIPTION OF THE DRAWINGS

The above and other objects, advantages and features of the present invention will be more apparent from the following description of certain embodiments taken in conjunction with the attached drawings, in which.

DETAILED DESCRIPTION OF PREFERRED EMBODIMENTS

Figure 1:
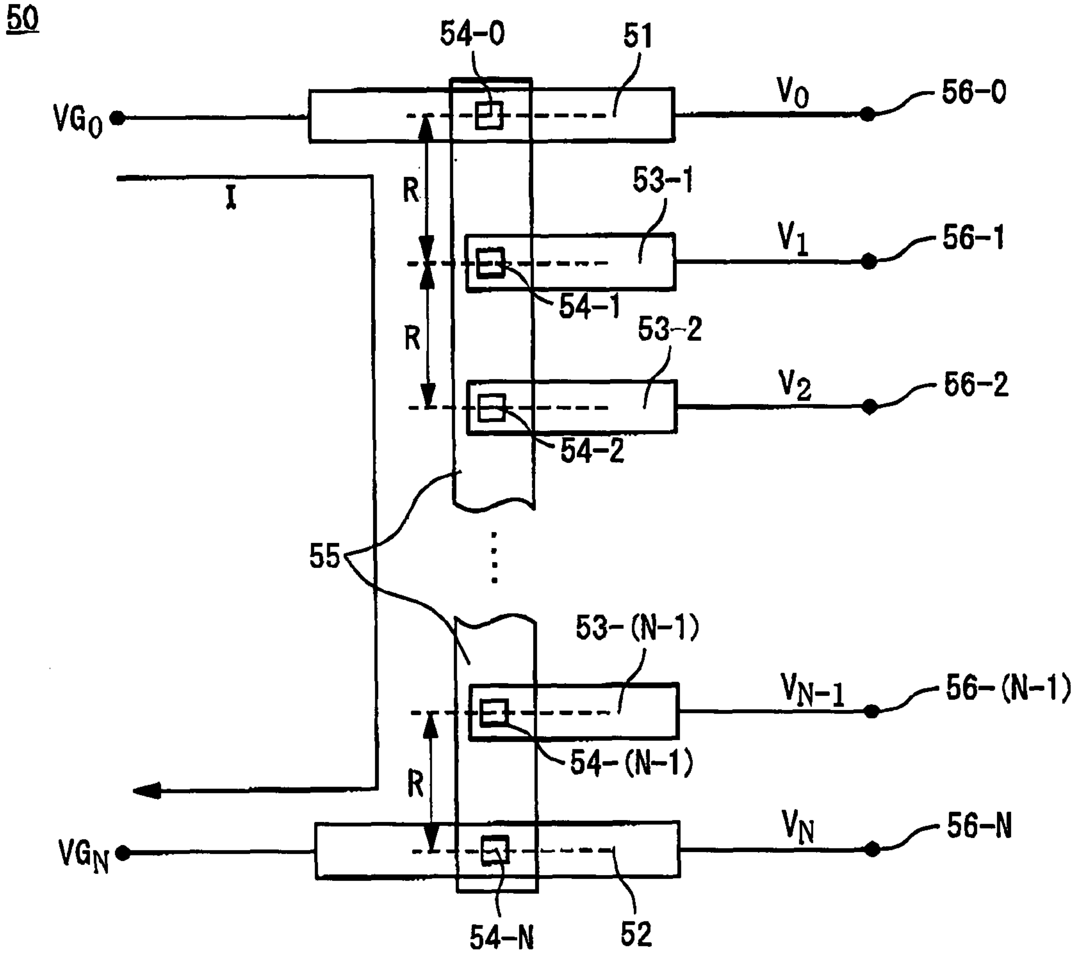
Fig. 1 RELATED ART
FIG. 1 is a plan view showing a layout pattern of a resistor string in a related art.
Figure 2:
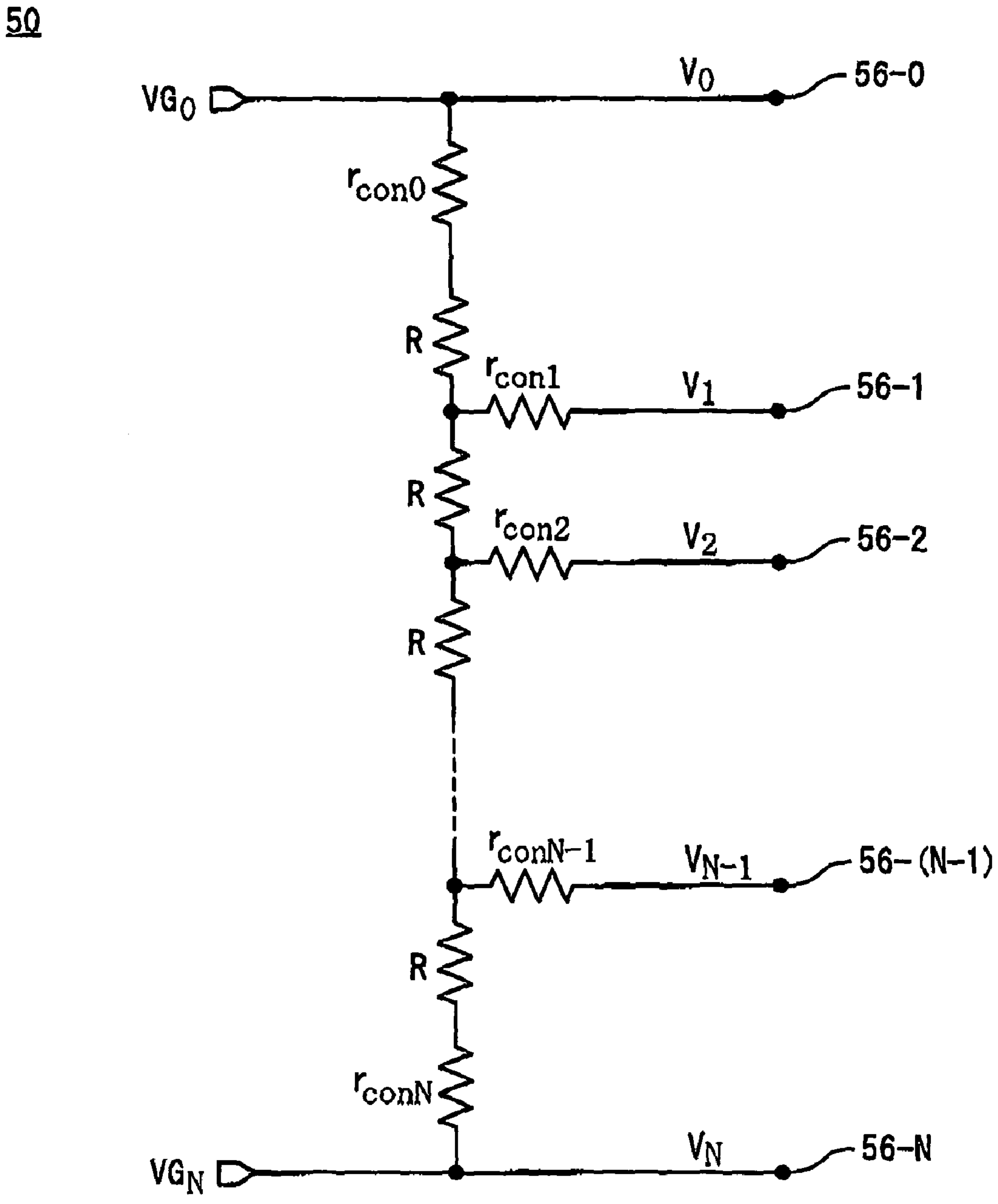
Fig. 2 RELATED ART
FIG. 2 is an equivalent circuit of the resistor string in the related art.

Hereinafter, a liquid crystal display apparatus using a data driver will be described with reference to the attached drawings. In the following description, same components and signals are assigned with same reference numerals and symbols. When a plurality of components are present, they are referred to with a representative reference numeral or symbol.

Configuration of Liquid Crystal Display Apparatus

Figure 3:
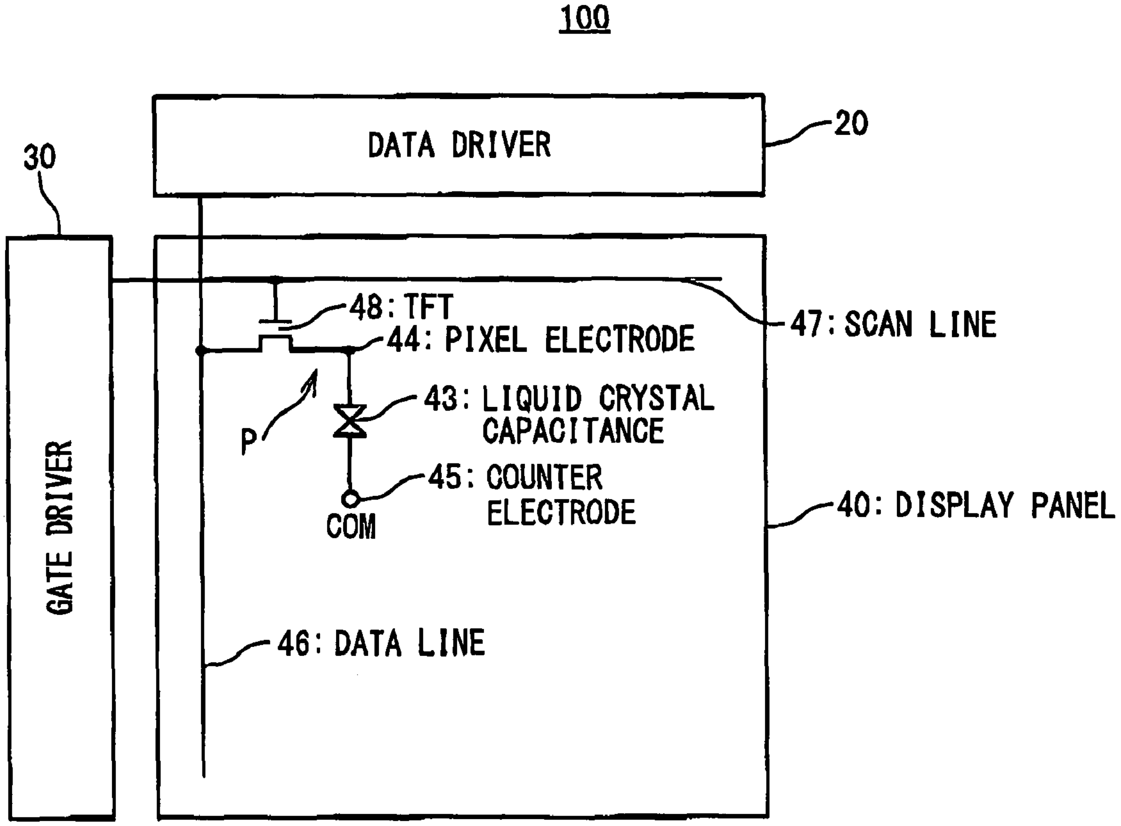
FIG. 3 is a block diagram showing a configuration of a liquid crystal display apparatus according to the present invention.
Figure 4:
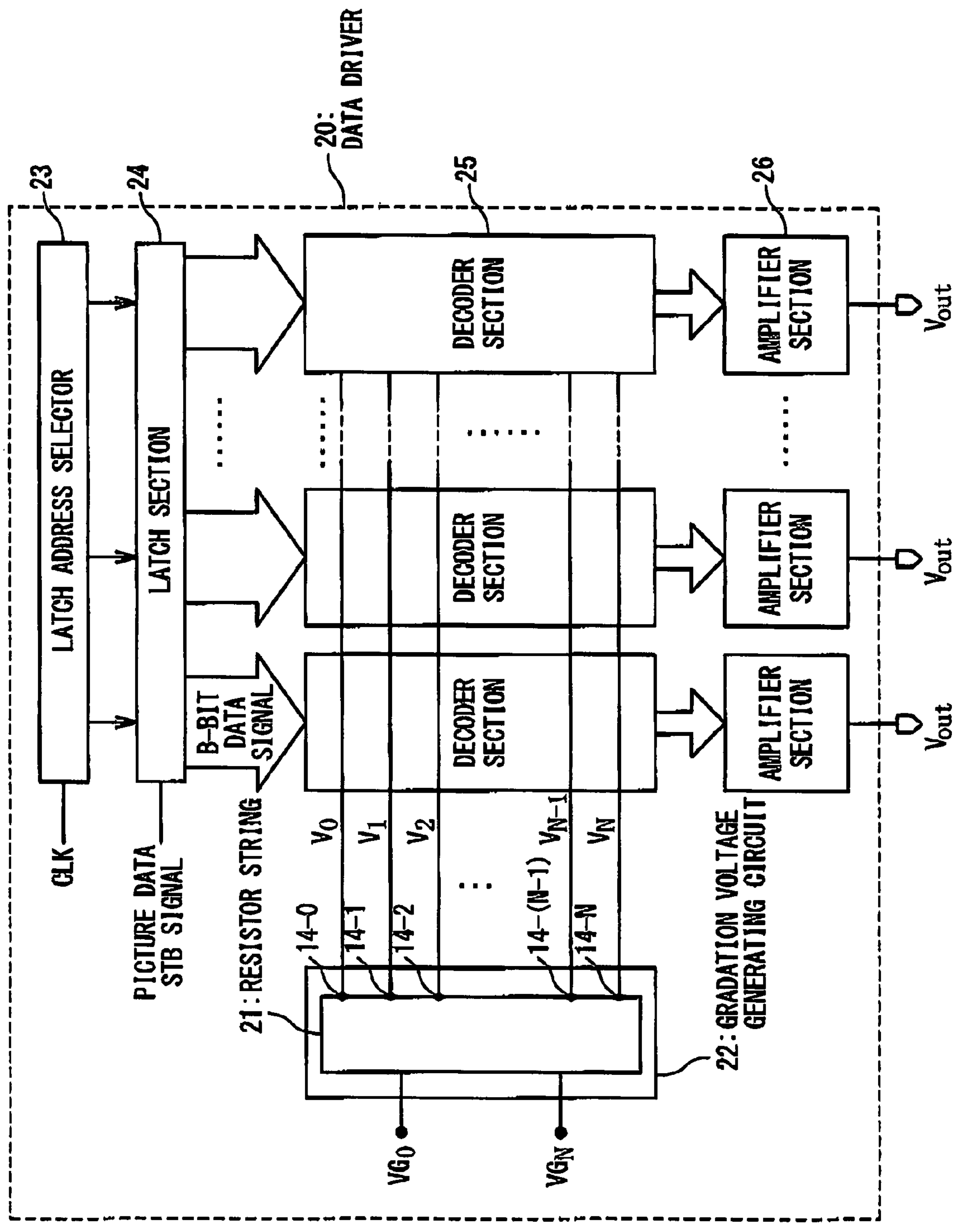
FIG. 4 is a block diagram showing a configuration of a data driver according to the present invention.

FIG. 3 is a block diagram showing a configuration of a liquid crystal display apparatus 100. FIG. 4 is a block diagram showing a configuration of the data driver 20. Referring to FIGS. 3 and 4, the liquid crystal display apparatus 100 using a gradation voltage generating circuit 22 according to the present invention will be described. The liquid crystal display apparatus 100 has a data driver 20, a gate driver 30, and a display panel 40. In the display panel 40, pixels Ps are provided in intersections of a plurality of data lines 46 and a plurality of scanning lines 47. Although, only a data line 46, a scanning line 47, and a pixel P are shown in FIG. 3, respectively, the plurality of data lines 46 and the plurality of gate lines 47 are provided in the actual display panel 40 and the plurality of pixels Ps are provided in a matrix manner. The data driver 20 outputs a data signal $V_{out}$ to each of the data lines 46, to drive the pixel P. The gate driver 30 drives each of the gate lines 47, and determines pixels P into one of which the data signal $V_{out}$ is written. The pixel P is provided with a TFT 48 and a liquid crystal capacitance 43 that is connected between a pixel electrode 44 as one end of the TFT 48 and a counter electrode 45. If the data signal $V_{out}$ is supplied through the data line 46 in a state of the TFT 48 is turned on by the gate driver 30, the data signal $V_{out}$ will be written in the liquid crystal capacitance 43.

Referring to FIG. 4, the data driver 20 has a gradation voltage generating circuit 22, a latch address selector 23, a latch section 24, a decoder section 25, and an amplifier section 26. The latch address selector 23 specifies an address of the pixel P to be driven to the latch section 24 in response to a clock signal CLK. The latch section 24 outputs video image data to the decoder section 25 as data signals of B bits in response to a strobe signal STB. The gradation voltage generating circuit 22 supplies gradation voltages $V_0$ to $V_N$ for driving the data lines 44 to the decoder section 25. Specifically, the gradation voltage generating circuit 22 has a resistor string 21 for outputting the gradation voltages $V_0$ to $V_N$ based on reference voltages (gamma voltages) $VG_0$ and $VG_N$ inputted thereto. A plurality of decoders and a plurality of amplifiers of the amplifier section 26 are provided in correspondence to the plurality of data lines 46. The resistor string 21 has nodes 14-0 to 14-N that output the gradation voltages $V_0$ to $V_N$, respectively, which are connected to the plurality of decoders through switching circuits (not shown). The decoder section 25 selects one of the gradation voltages $V_0$ to $V_N$ based on the data signal from the latch section 24. Here, the gradation voltage selected by the decoder section 25 is supplied to an input of a differential amplifier (e.g. a gate terminal of differential transistor of a differential amplifier) of the amplifier section 26. That is, the nodes 14-0 to 14-N will be connected with capacitive loads (i.e. a parasitic capacitance of the gate terminal of the differential transistor), and accordingly, no static current will flow between the nodes 14-0 to 14-N and the input of the amplifier of the amplifier section 26. Moreover, two or more gradation voltages may be simultaneously selected by the decoder section 25. In this case, although the nodes 14 outputting the selected gradation voltages are connected to inputs of the differential amplifier of the amplifier section 26, no static current flows between the nodes 14 and the inputs of the differential amplifiers, like the above-mentioned case. The amplified voltage is outputted to the data line 44 as the data signal $V_{out}$.

First Embodiment

Figure 5:
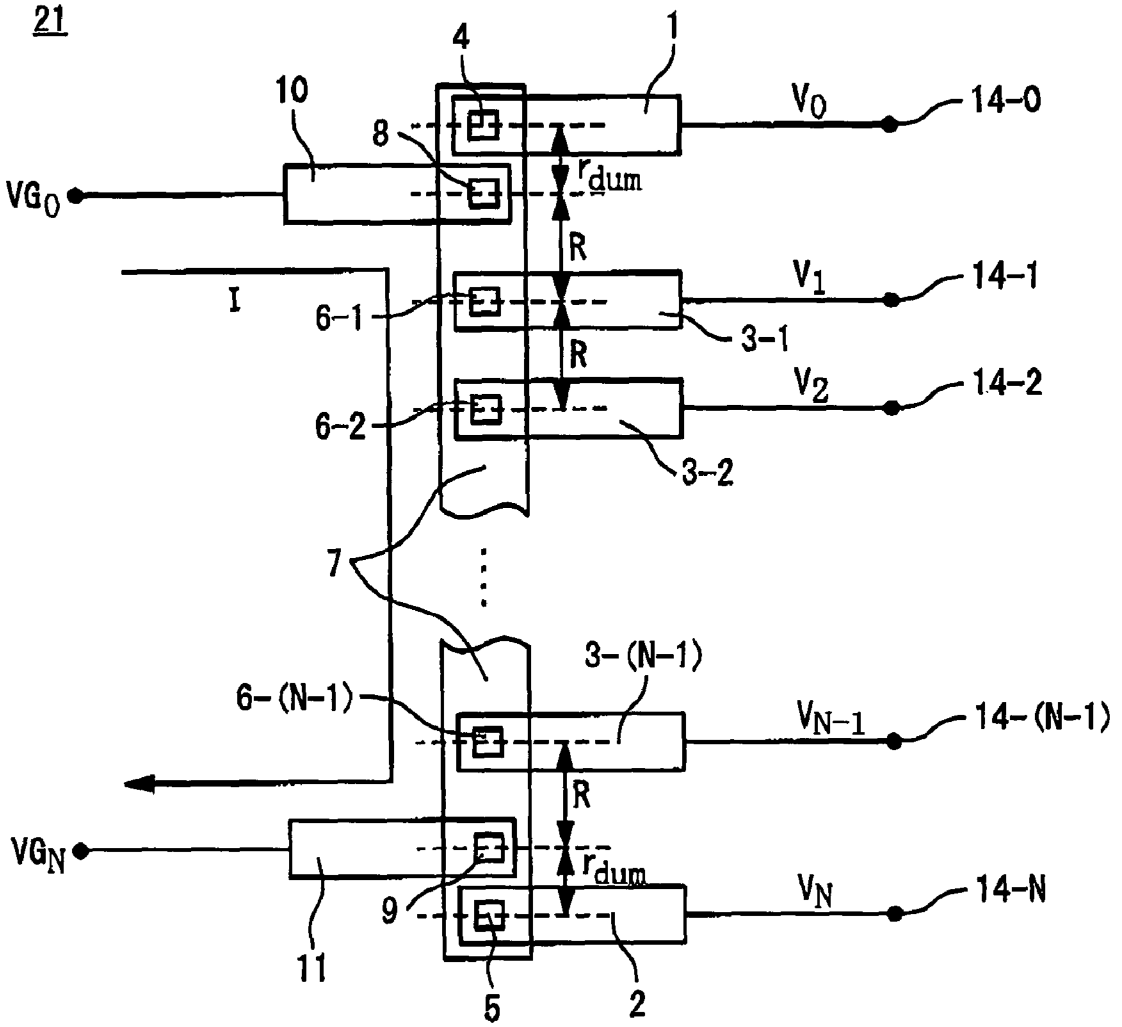
FIG. 5 is a plan view showing a layout pattern of a resistor string in a first embodiment of the present invention.
Figure 6:
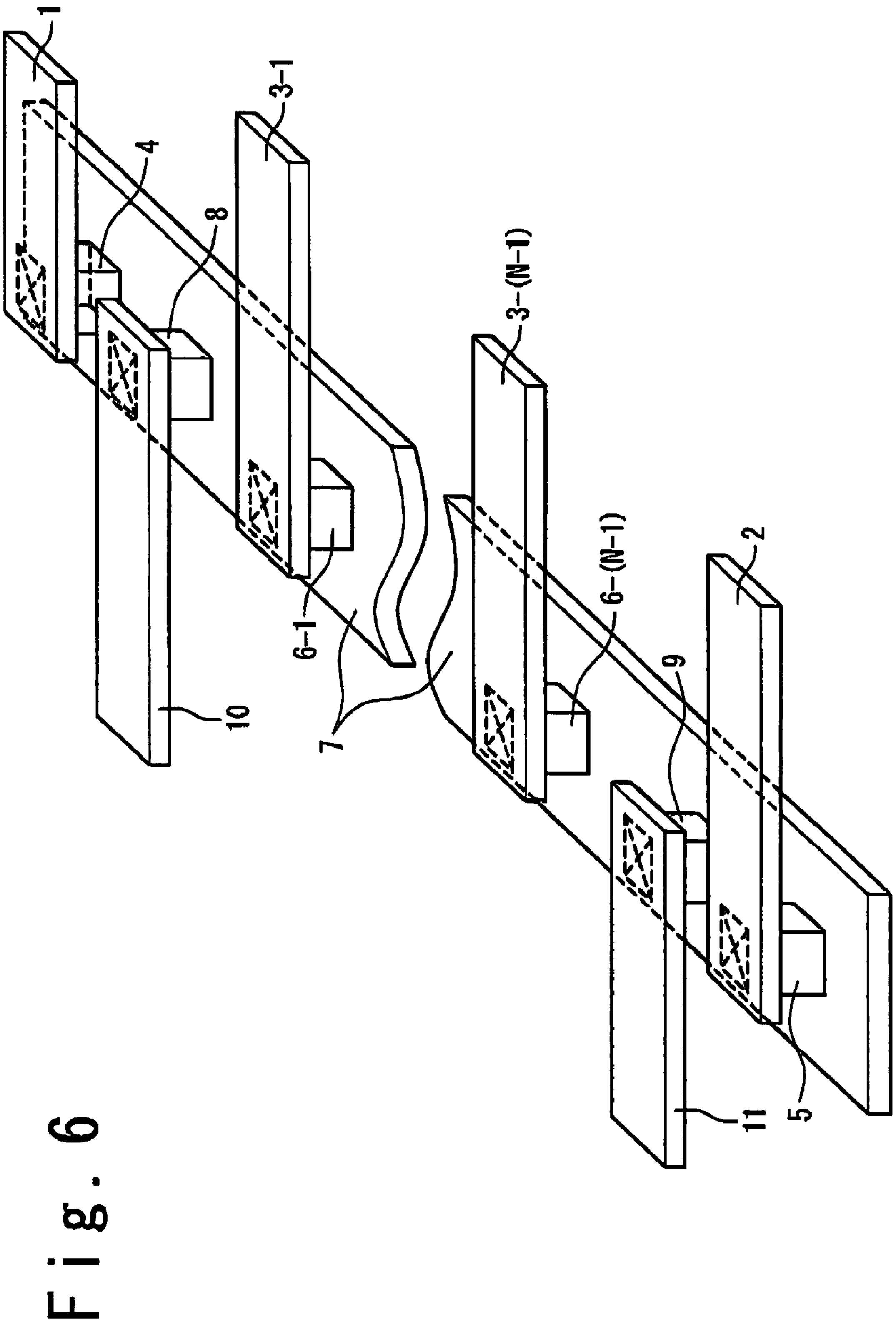
FIG. 6 is a perspective view showing the resistor string in the first embodiment.
Figure 7:
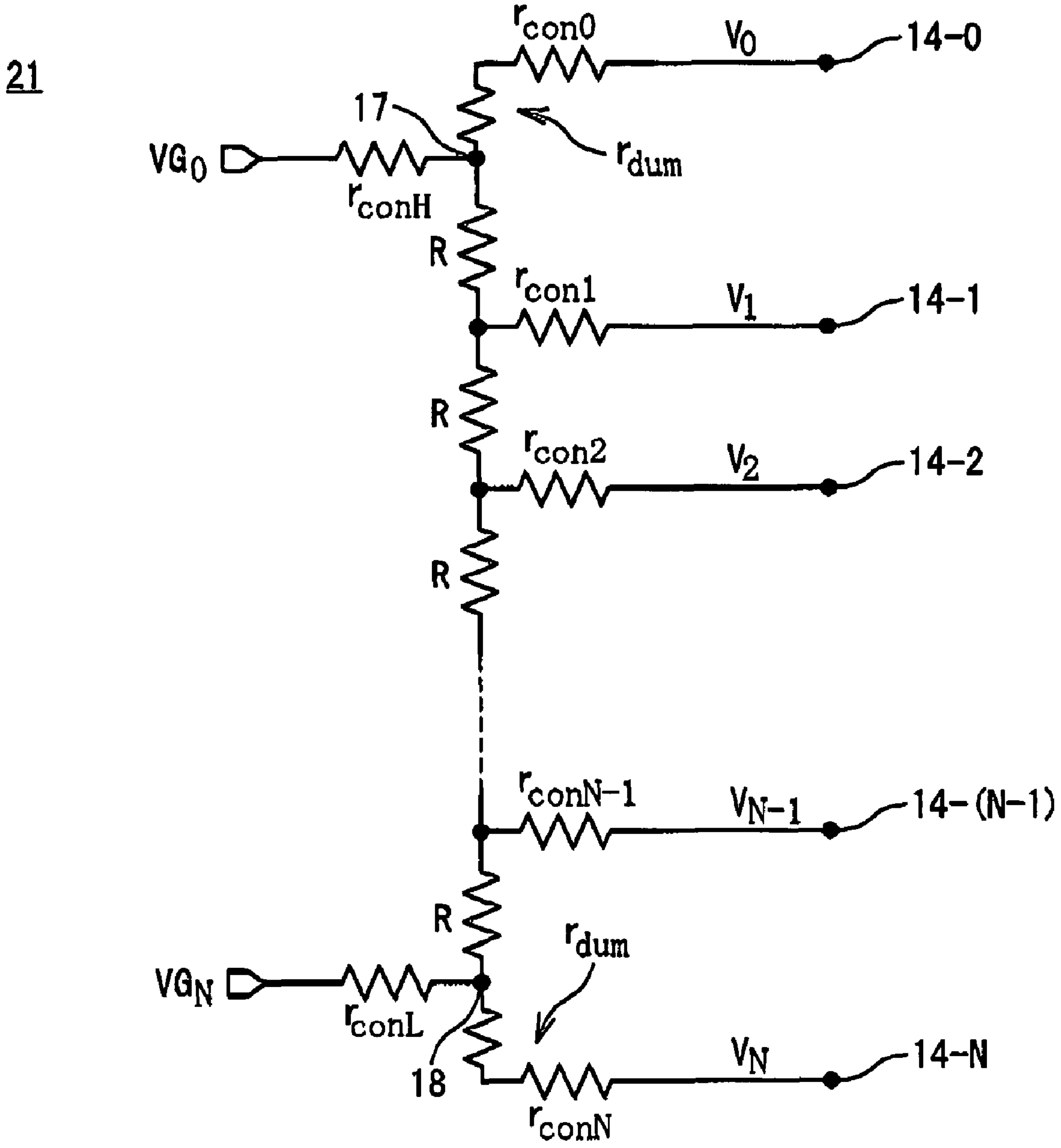
FIG. 7 is an equivalent circuit of the resistor string in the first embodiment.

Referring to FIGS. 5 to 7, the resistor string according to a first embodiment of the present invention shown in FIG. 4 will be described. In this embodiment, the resistor string will be described.

(Layout Pattern of Resistor String 21)

FIG. 5 is a plan views showing a layout pattern of the resistor string 21 in the first embodiment. FIG. 6 is a perspective view of the resistor string 21. Referring to FIGS. 5 and 6, the resistor string 21 outputs the gradation voltages $V_0$ to $V_N$ from the nodes 14-0 to 14-N through contacts 4, 6-1 to 6-(N-1), and 5 based on the reference voltages $VG_0$ and $VG_N$ supplied to one resistance element 7. Specifically, the one resistance element 7 is provided with the contacts 8 and 9, to which the reference voltages $VG_0$ and $VG_N$ are supplied through wirings 10 and 11. Moreover, (N-1) contacts 6-1 to 6-(N-1) are provided between the contact 8 and the contact 9 on the resistance element 7 in a same interval, and the resistance element between the adjacent contacts forms a resistors Rs. The contacts 6-1 to 6-(N-1) in the present embodiment are provided on a shortest-distance line connecting the contact 8 and the contact 9 on the resistance element 7. The wirings 3-1 to 3-(N-1) are connected to the contacts 6-1 to 6-(N-1), respectively, from which the gradation voltages $V_1$ to $V_{N-1}$ are supplied to the nodes 14-1 to 14-(N-1). In addition, in FIG. 6, the height of each contact does not need to be equal to each other. Moreover, each wiring may be under the resistance element 7, instead of being above it.

Moreover, the contacts 4 and 5 are provided in the resistance element 7 outside the area between the contact 8 and the contact 9 and the gradation voltages $V_0$ and $V_N$ are taken out by using the contacts 4 and 5. For example, as shown in FIG. 5, the contact 4 is provided in the area of the resistance element 7 on the opposite side to the contact 6-1 with respect to the contact 8. In this case, it is preferable that an interval between the contact 4 and the contract 8 is sufficiently small. Similarly, the contact 5 is provided in the area of the resistance element 7 on the opposite side of the contact 6-N with respect to the contact 9, and preferably the interval between the contact 5 and the contact 9 is sufficiently small. Here, between the contact 4 and the contact 8 and between the contact 5 and the contact 9, dummy resistors $r_{dum}$s are formed of the resistance element. It is preferable that this dummy resistor $r_{dum}$ is almost equal to zero. A wiring 1 is connected to the contact 4, and a gradation voltage $V_0$ of a value almost equal to the $VG_0$ is supplied to the node 14-0 through the wiring 1. Similarly, a wiring 2 is connected to the contact 5, and a gradation voltage $V_N$ of a value almost equal to the $VG_N$ is supplied to the node 14-N through the wiring 2.

Here, if the reference voltage $VG_0$ is set to be a larger voltage value than the reference voltage $VG_N$, the gradation voltage $V_0$ becomes a maximum of the gradation voltages and the gradation voltage $V_N$ becomes a minimum of the gradation voltages. That is, in the present invention, the contacts 4 and 5 that serve as output ports of the maximum and minimum gradation voltages are provided outside the area between the contact 8 and the contact 9 that serve as supply ports of the reference voltages. In other words, the contacts 4 and 5 serve as the output ports of the gradation voltages $V_0$ and $V_N$ closest to the reference voltages $VG_0$ and $VG_N$ and are provided outside the area between the contact 8 and the contact 9. In addition, if the contacts 6-1 to 6-(N-1) are provided in the area on the shortest line between the contacts 8 and 9, it is advantageous in terms of area cost because a circuit area can be reduced.

Here, the wirings 1, 2 and 3-1 to 3-(N-1) and the wirings 10 and 11 are preferably metal wirings. The wiring 1 is separated from the wiring 10, and the wiring 2 is separated from the wiring 11.

(Voltage Division by Resistor String 21)

By the above-mentioned configuration, the resistor string 21 supplies the generation voltages $V_0$ to $V_N$ to the nodes 14-0 to 14-N based on the reference voltages $VG_0$ and $VG_N$. In this case, since capacitive loads (i.e. a parasitic capacitance of the gate terminal of the differential transistor) in the amplifier section 26 are connected to the nodes 14-0 to 14-N, no static currents flow through paths from the contacts 4, 6-1 to 6-(N-1), and 5 to the nodes 14-0 to 14-N in a steady state. On the other hand, depending on a voltage difference between the reference voltage $VG_0$ and the reference voltage $VG_N$, a static current I flows between the contact 8 and the contact 9. In this case, the static current I flows through a path from the contact 8 to the contact 9 via the contacts 6-1 to 6-(N-1). However, since the contacts 4 and 5 are not provided between the contact 8 and the contact 9, they are outside the path of the static current I.

FIG. 7 is an equivalent circuit of the resistor string 21 in the first embodiment. Referring to FIG. 7, an effect of contact resistance in the resistor string 21 will be described. Here, resistances of the contacts 8 and 9 are supposed to be contact resistances $r_{conN}$ and $r_{conL}$, respectively, resistances of the contacts 4 and 5 are supposed to be contact resistances $r_{con0}$ and $r_{conN}$, respectively, and resistances of the contacts 6-1 to 6-(N-1) are supposed to be contact resistances $r_{con1}$ to $r_{conN-1}$, respectively.

Referring to FIG. 7, N resistors R obtained from the resistance elements 7 are connected in series between the node 17 and the node 18. Connection nodes between the resistors R are connected to the nodes 14-1 to 14-(N-1) through the contact resistances $r_{con1}$ to $r_{conN-1}$. Also, the node 17 is connected to the node 14-0 through a dummy resistor $r_{dum}$ and the contact resistance $r_{con0}$, and the node 18 is connected to the node 14-N through the dummy resistor $r_{dum}$ and the contact resistance $r_{conN}$. Further, the reference voltage $VG_0$ is supplied to the node 17 through the contact resistance $r_{conH}$, and the reference voltage $VG_N$ is supplied to the node 18 through the contact resistance $r_{conL}$.

As described above, a current does not flow through the contacts 4, 5, and 6-1 to 6-(N-1) in a steady state. That is, no static current flows through the dummy resistor $r_{dum}$ and the contact resistances $r_{con0}$ to $r_{conN}$. For this reason, effects of the voltage drops due to the dummy resistor $r_{dum}$ and the contact resistances $r_{con0}$ to $r_{conN}$ on the gradation voltages $V_0$ to $V_N$ are removed. Moreover, the static current I flows through N resistors R via the contact resistances $r_{conH}$ and $r_{conL}$. For this reason, the reference voltages $VG_0$ and $VG_N$ whose voltages drooped due to the contact resistances $r_{conH}$ and $r_{conL}$ are supplied to the nodes 17 and 18, respectively. Thus, effects of the voltage drops due to the contact resistances $r_{conH}$ and $r_{conL}$ do not affect relative errors among the gradation voltages because they act on all the values of the gradation voltages 14-0 to 14-N uniformly. That is, the resistor string 21 according to the present invention can supply the gradation voltages $V_0$ to $V_N$ that approximate a desired gamma curve better than the technique in the related art.

As described above, according to the present invention, the contacts 4 and 5 are provided in an area out of the current path of the static current I based on the reference voltages to take out the maximum and minimum values of the gradation voltage, i.e., the gradation voltage $V_0$ and the gradation voltage $V_N$. For this reason, effects of the contact resistances $r_{conH}$ and $r_{conL}$ due to the contacts 8 and 9 to which the reference voltages are supplied are given to all the gradation voltages $V_0$ to $V_N$ uniformly and relative errors of the gradation voltages can be suppressed.

Moreover, in the resistor string of a plurality of resistance elements in the technique in the related art, the relative errors among the gradation voltages were large due to a manufacturing variation of the contact resistances. Furthermore, in the technique in the related art using the plurality of resistance elements, many contacts are needed to connect the resistors. On the other hand, in the present invention, since the resistor string uses only the one resistance element 7, the gradation voltages are not affected due to the contact resistances $r_{con0}$ to $r_{conN}$ of the contacts that serve as output ports of the gradation voltages, and the relative errors among the gradation voltages can be reduced. Moreover, the number of contacts may be made less than a case of using the plurality of resistance elements. For this reason, according to the present invention, a high-yield gradation voltage generating circuit can be provided.

In this embodiment, although the resistor string using the single resistance element 7 has been described, the present invention is not limited to this and the present invention can also be applied to a resistor string using a plurality of resistance elements. In this case, like a case that the single resistance element 7 is used, what is necessary is just to provide the contacts 4 and 5 for taking out the gradation voltages $V_0$ and $V_N$ so that they may not be located between the contacts 8 and 9 to which the reference voltages $VG_0$ and $VG_N$ are supplied. That is, it is necessary that the contacts 4 and 5 should be formed outside a region for a static current due to the reference voltages. This configuration allows a relative error between the gradation voltages to be reduced since the effects of the voltage drops due to the contact resistances $V_{conH}$ and $V_{conL}$ uniformly act over all the gradation voltages $V_0$ to $V_N$ even in the resistor string using the plurality of resistance elements.

Modification of First Embodiment

Figure 8:
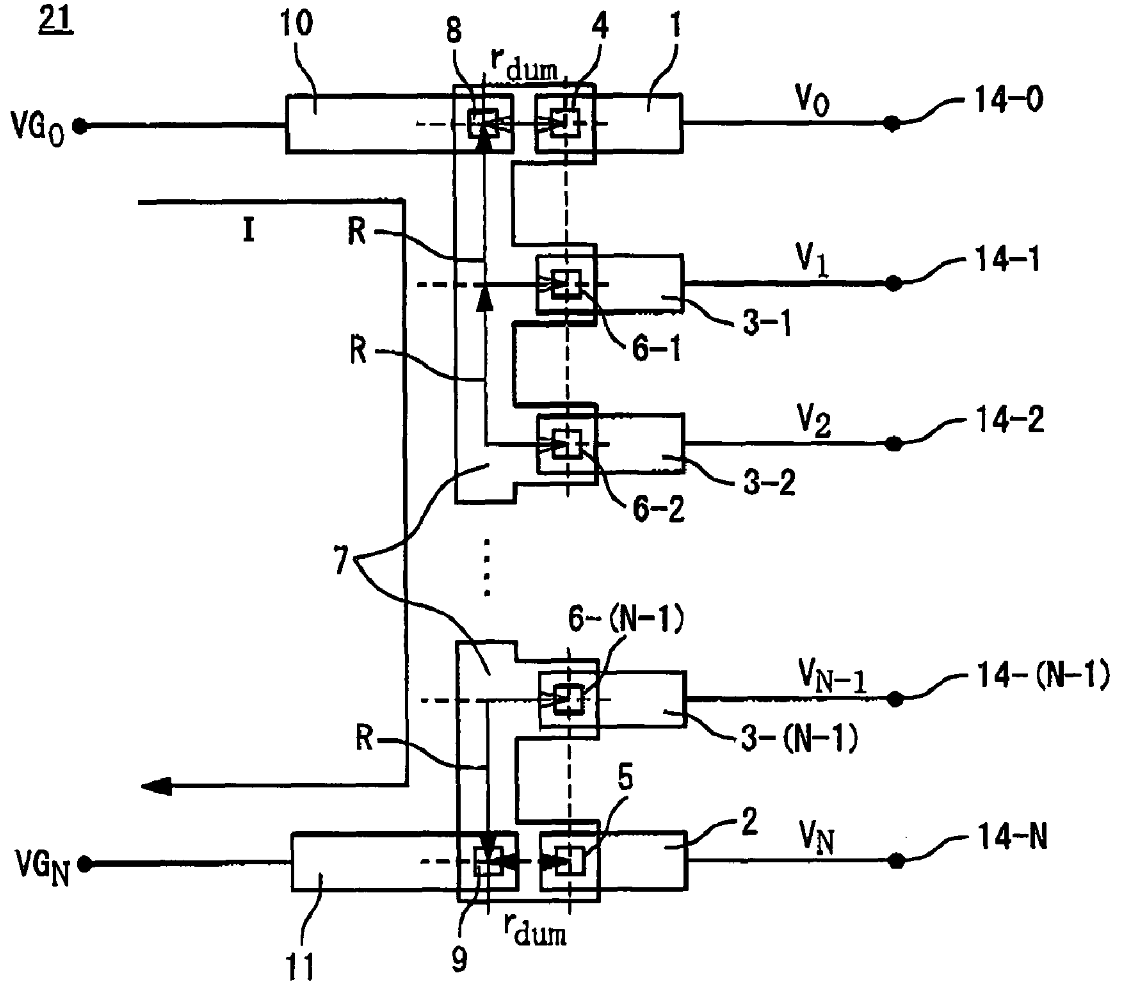
FIG. 8 is a plan view showing a modification example of a layout pattern of the resistor string in the first embodiment.
Figure 9:
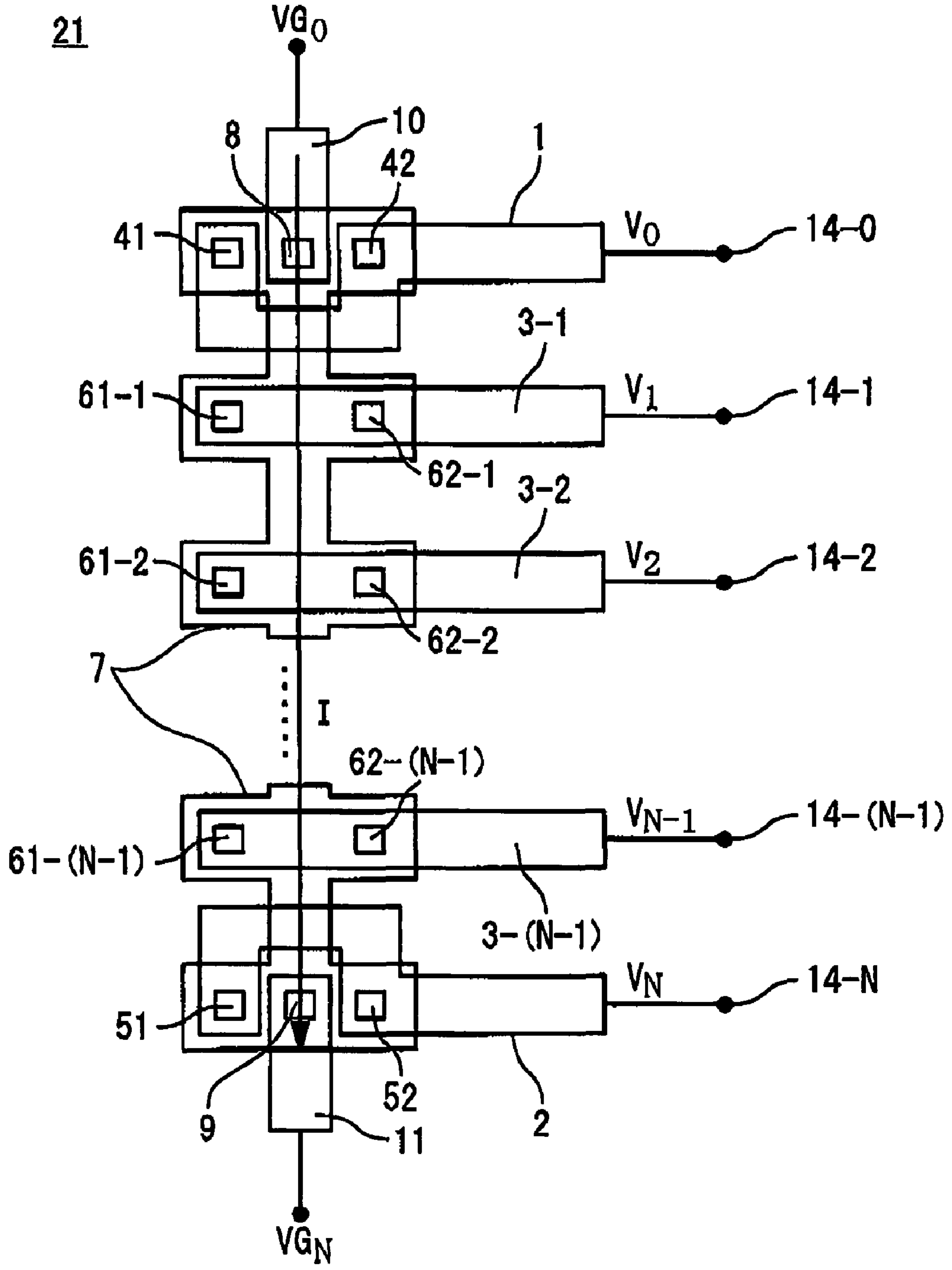
FIG. 9 is a plan view showing a modification example of a layout pattern of the resistor string in the first embodiment.

FIGS. 8 and 9 are plan views showing a modification example of a layout pattern of the resistor string 21 in the first embodiment. Referring to FIGS. 8 and 9, the layout pattern of the resistor string 21 will be described in which contacts for taking out the gradation voltages $V_0$ to $V_N$ are provided at positions deviating from the current path of the static current I.

Referring to FIG. 8, the contacts 8 and 9 are provided for the resistor string 21 of the single resistance element 7, and the reference voltages $VG_0$ and $VG_N$ are supplied into the resistor string 21 through the wirings 10 and 11, respectively. (N-1) contacts 6-1 to 6-(N-1) are provided in a same interval between the contact 8 and the contact 9 on the resistance element 7, and each resistor R is formed by the each resistance element between the contacts. In this case, the contacts 6-1 to 6-(N-1) are provided in an area outside the shortest-distance line between the contact 8 and the contact 9 on the resistance element 7 (i.e., the current path of the static current I between the contact 8 and the contact 9). It is preferable that the shortest-distance line between the contacts 8 and 9 is separated from the contacts 6-1 to 6-(N-1) by a distance that the static current I is not disturbed by the contacts 6-1 to 6-(N-1). Wirings 3-1 to 3-(N-1) are connected to the contacts 6-1 to 6-(N-1), and the gradation voltages $V_1$ to $V_{N-1}$ depending on a difference of the reference voltage $VG_0$ and the reference voltage $VG_N$ are supplied to the nodes 14-1 to 14-(N-1).

Moreover, referring to FIG. 8, the contacts 4 and 5 for taking out the gradation voltages $V_0$ and $V_N$ are provided on the resistance element 7 existing outside the area between the contact 8 and the contact 9. Here, the contact 4 is provided in an area adjacent to the contact 8, on the same side as the contact 6-1 with respect to the shortest-distance line between the contact 8 and the contact 9. Here, it is preferable that the contact 4 is provided adjacently to the contact 8 and being in an area on a line orthogonal to the shortest-distance line. Moreover, it is preferable that the contact 4 is provided in a same manner as the contacts 6-1 to 6-(N-1). Similarly, the contact 5 is provided adjacently to the contact 9 on the side of the contact 6-(N-1) in an area on a line orthogonal to the shortest-distance line between the contacts 8 and 9. Here, dummy resistors $r_{dum}$ are provided by the resistance element between the contact 4 and the contact 8 and between the contact 5 and the contact 9, respectively. It is preferable that this dummy resistor $r_{dum}$ is almost equal to zero. The wiring 1 is connected to the contact 4, and the gradation voltage $V_0$ almost equal to the voltage $VG_0$ is supplied to the node 14-0 through the wiring 1. Similarly, the wiring 2 is connected to the contact 5, and the gradation voltage $V_N$ almost equal to the voltage $VG_N$ is supplied to the node 14-N through the wiring 2.

As described above, if the resistor string 21 is formed using the layout pattern as shown in FIG. 8, it is possible to restrict the current I flowing between the contact 8 and the contact 9 so as to exist only in a path within the resistance element 7. In the layout pattern shown in FIG. 5, the resistance element 7 on the current path of the static current I may become thin due to the contacts 6-1 to 6-(N-1), and a resistance value may be varied. Moreover, a variation value of the resistance value is not uniform because of the manufacturing variation of the contact. Therefore, the resistor string 21 is formed in the layout pattern as shown in FIG. 8 and can supply the gradation voltages $V_0$ to $V_N$ with still higher-accuracy (with few relative error) than the resistor string shown in FIG. 5.

The layout pattern of the resistor string 21 shown in FIG. 9 is an example in which the contacts for taking out the gradation voltages are provided outside an area of the shortest path (the path of the static current I) between the contacts 8 and 9, like the layout pattern shown in FIG. 8, so that a symmetric property may be given to the shortest path. Specifically, several pairs of contacts 61-1 and 62-1, . . . , 61-*i* and 62-*i*, . . . , 61-(N-1) and 62-(N-1) are provided on the resistance element 7 so that each pair may sandwich a path of the static current I between the contacts 8 and 9 of the resistance element 7, and the gradation voltages $V_1$ to $V_{N-1}$ are taken out from respective contact pairs. Here, each contact pair (for example, the contacts 61-1 and 62-1) is provided symmetrically to the static current I.

Contacts 41 and 42 and contacts 51 and 52 for taking out the gradation voltages $V_0$ and $V_N$ are provided on the resistance element 7 existing outside an area between the contact 8 and the contact 9. In this case, one pair of the contact 41 and the contact 42 is provided symmetrically so as to sandwich the contact 8. Similarly, one pair of the contact 51 and the contact 52 is provided symmetrically so as to sandwich the contact 9. Moreover, the wiring 1 is connected to the contacts 41 and 42, and the gradation voltage $V_0$ almost equal to the voltage $VG_0$ is supplied to the node 14-0 through the wiring 1. Similarly, the wiring 2 is connected to the contacts 51 and 52, and the gradation voltage $V_N$ almost equal to the voltage $VG_N$ is supplied to the node 14-N through the wiring 2.

As described above, the resistor string 21 shown in FIG. 9 is provided with the contact pairs for taking out the gradation voltages $V_1$ to $V_N$ at positions deviated from the path of the static current I. For this reason, in comparison with the resistor string 21 shown in FIG. 8, the layout pattern has symmetric property and can suppress the manufacturing variation. Moreover, in the resistor string 21 shown in FIG. 8, since the contacts exist only on one side in the vicinity of the current path, there is a possibility that an effect by an electric field in the neighborhood of the contact may become ununiform. However, in the resistor string 21 shown in FIG. 9, since the contacts are symmetrically provided with respect to the current path, the effect of the electric field in the vicinity of the contacts is uniform and the effect of the electric field in the vicinity of the contacts on the static current I, namely, the effect on an accuracy of the gradation voltages can be suppressed.

Second Embodiment

Figure 10:
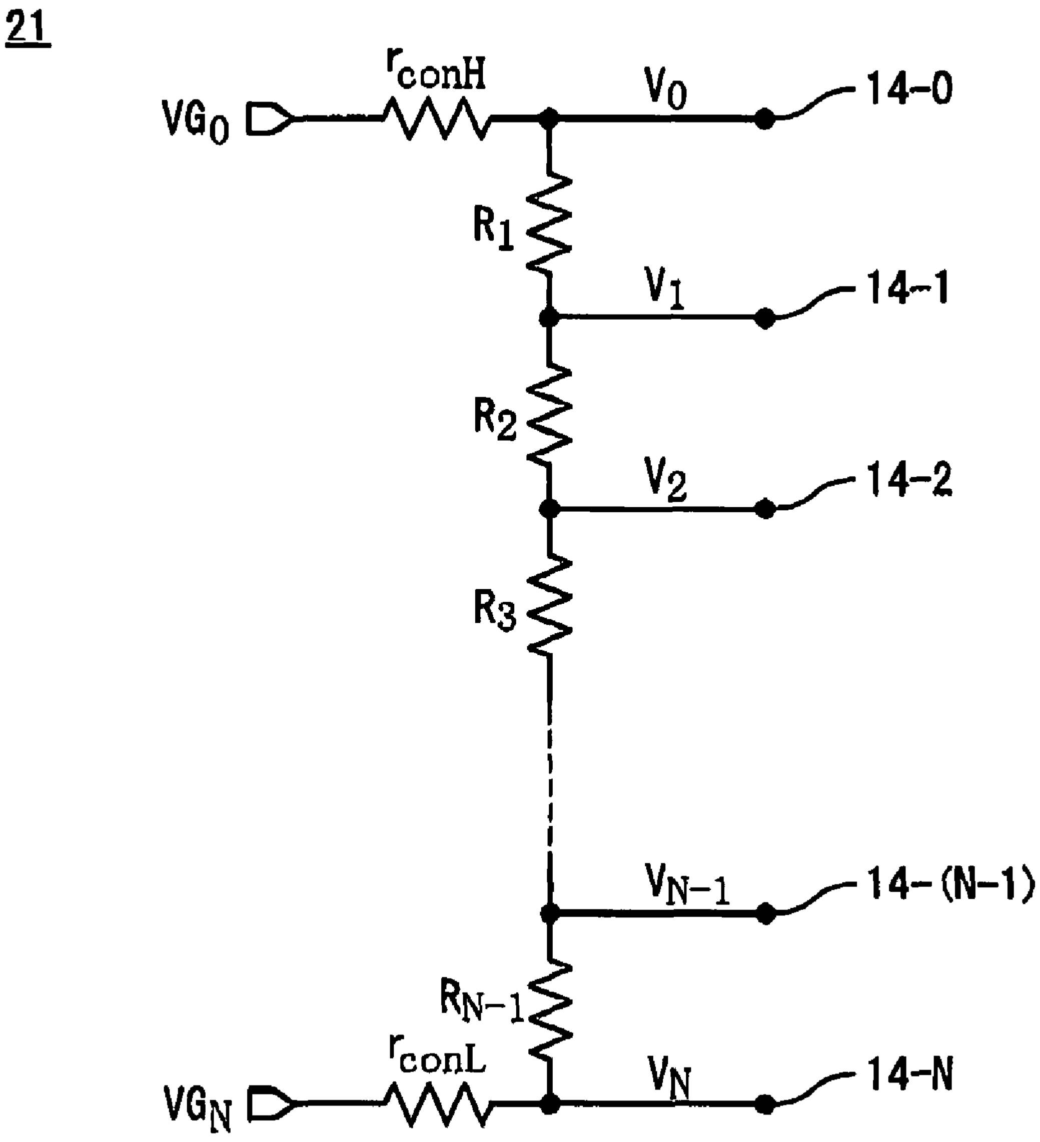
FIG. 10 is an equivalent circuit or a resistor string in a second embodiment of the present invention.
Figure 11:
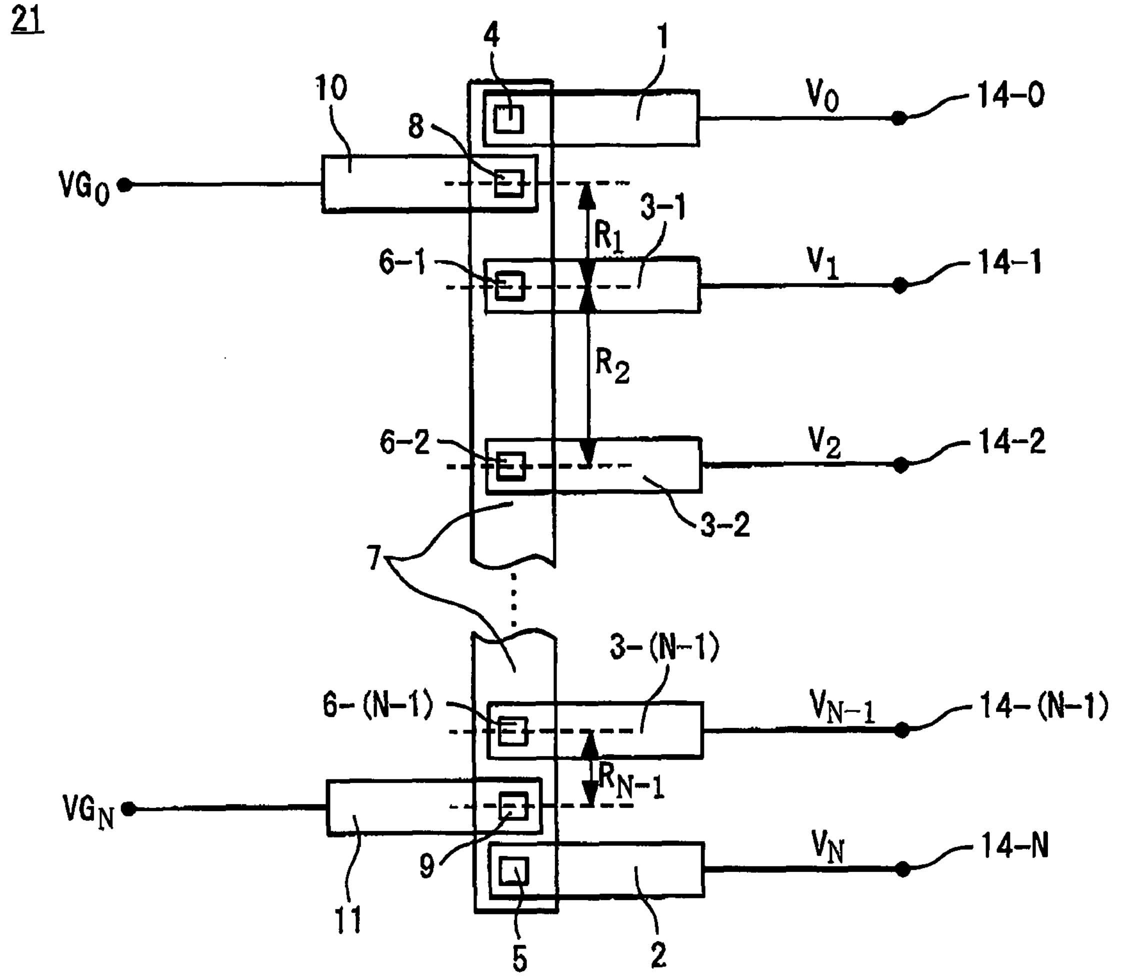
FIG. 11 is a plan view showing a layout pattern of the resistor string in the second embodiment.

Referring to FIGS. 10 and 11, the data driver with the resistor string 21 in a second embodiment will be described. In the first embodiment, the divided resistors for determining the gradation voltages are as static as the resistor R. In the second embodiment, a case where the divided resistors among the division electrodes are different will be described.

FIG. 10 is an equivalent circuit of the resistor string 21 in the second embodiment. Here, the dummy resistor $r_{dum}$ and the contact resistances $r_{con0}$ to $r_{conN}$ that have been described in the first embodiment are omitted (since a static current does not flow through the above contacts, so that the effect of the voltage drop due to the contact resistance can be neglected). Referring to FIG. 10, the resistor string 21 used in the gradation voltage generating circuit 22 usually uses the resistors $R_1$ to $R_{N-1}$ of mutually different resistance values as the divided resistors to divide the reference voltages. FIG. 11 is a plan view showing a layout pattern of the resistor string 21 in the second embodiment. Referring to FIG. 11, in the resistor string 21 in the second embodiment, distances among the contacts 6-1 to 6-(N-1) for taking out the gradation voltages $V_1$ to $V_{N-1}$ are set to have desired resistance values ($R_2$, $R_3$, . . . , $R_{N-1}$). Here, a distance between the contact 8 and the contact 6-1 is set so as to be the resistor $R_1$ and a distance between the contact 6-(N-1) and the contact 9 is set so as to be the resistance $R_N$. Since other layout patterns are the same as that of the first embodiment, their explanation is omitted.

As described above, the present invention can also be applied to the resistor string that generates the gradation voltages with the divided resistors having different resistance values, and can suppress the relative errors of the gradation voltages $V_0$ to $V_N$, like the first embodiment.

Third Embodiment

Figure 12:
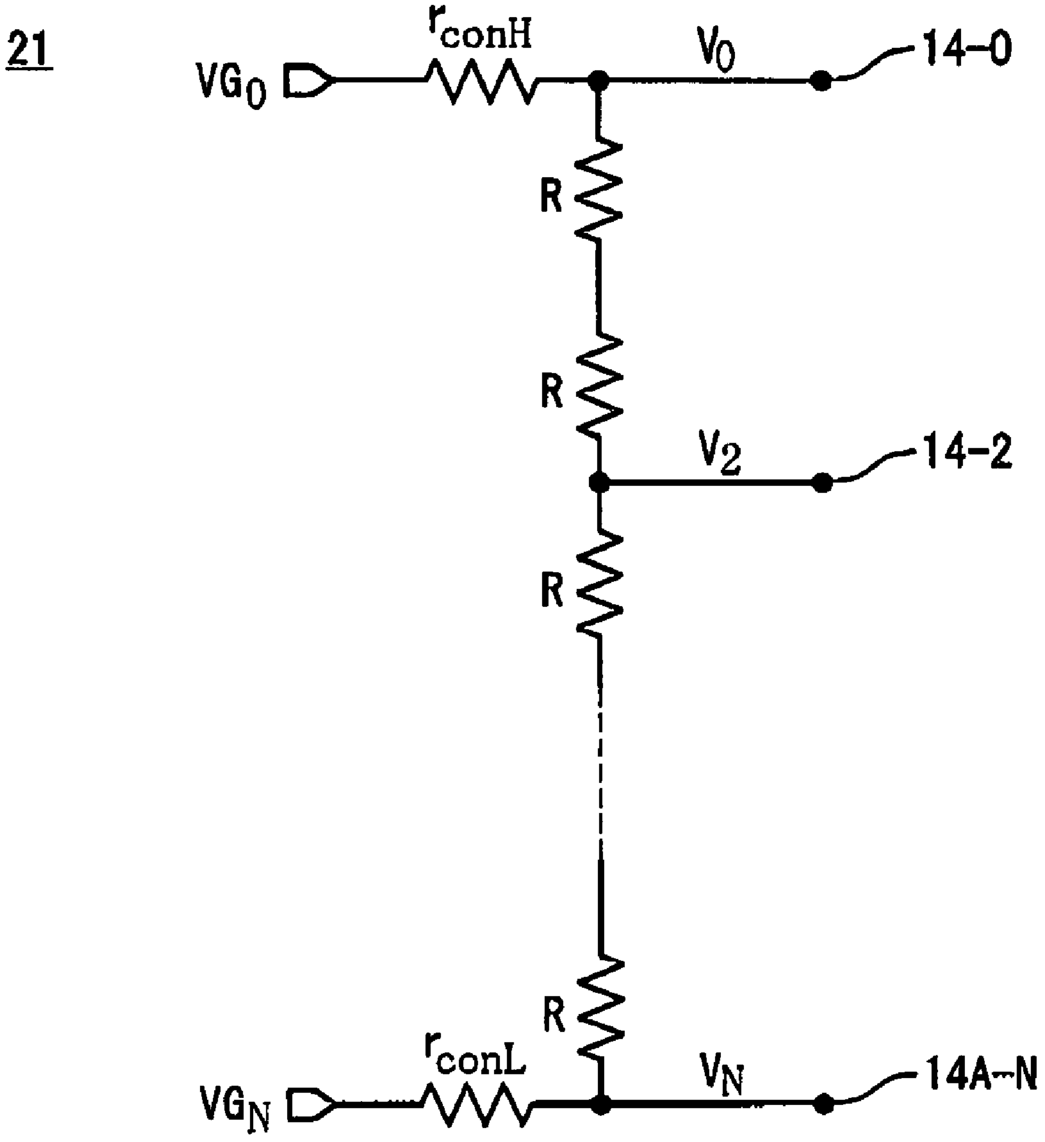
FIG. 12 is an equivalent circuit of the resistor string in a third embodiment of the present invention.
Figure 13:
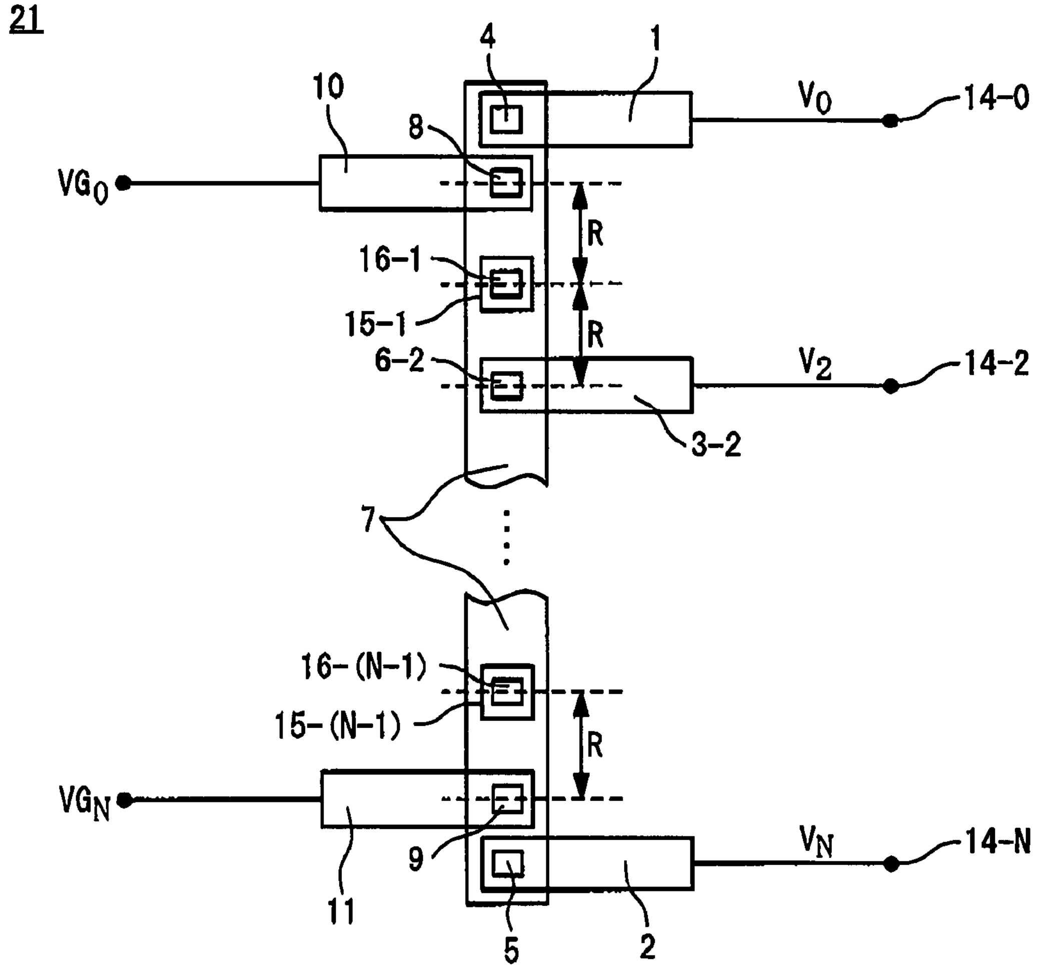
FIG. 13 is a plan view showing a layout pattern of the resistor string in the third embodiment.

Referring to FIGS. 12 and 13, the data driver with the resistor string 21 in a third embodiment will be described. In the resistor string 21 in the first embodiment, the gradation voltages are taken out from the divided electrodes each provided for the each resistor R. In the third embodiment, a resistor string such that the gradation voltage is taken out from each divided electrode provided (the contact and the wiring) for each of the plurality of resistors will be described.

FIG. 12 is an equivalent circuit of the resistor string 21 in the third embodiment. Here, the dummy resistor $r_{dum}$ and the contact resistances $r_{con0}$ to $r_{conN}$ that have been described in the first embodiment are omitted (since a static current does not flow through the above contacts, so that the effect of the voltage drop due to the contact resistance can be neglected). FIG. 12 shows the resistor string 21 to which the nodes 14-0, 14-2, . . . , and 14-N for taking out the gradation voltage therefrom are connected for every two resistors Rs, as an example. FIG. 13 shows a layout pattern of the resistor string 21 in this case. Referring to FIG. 13, the resistor string 21 in the third embodiment is provided with dummy contacts 16-1, 16-3, . . . , 16-(N-1) and dummy wirings 15-1, 15-3, . . . , and 15-(N-1), instead of the contacts 6-1, 6-3, . . . , and 6-(N-1) and the wirings 3-1, 3-3, . . . , and 3-(N-1) in the first embodiment. Any gradation voltage is not taken out from the dummy wiring 15-1, 15-3, . . . , and 15(N-1). That is, the contact 6-2, 6-4, . . . , 6-(N-2) and the wiring 3-2, 3-4, . . . , 3-(N-2) for taking out the gradation voltage to the node 14-2, 14-4, . . . , 14-(N-2) are provided in the every two resistors R, and the gradation voltages $V_0$, $V_2$, and $V_N$ are supplied to the nodes 14-0, 14-2, . . . , and 14-N, respectively. Since other portions of the layout pattern are the same as those of the first embodiment, their description is omitted. Although the gradation voltage is taken out for every two resistors R in the present embodiment, the number of the resistors is not restricted to this.

As described above, the present invention can also be applied to the resistor string for generating gradation voltages with the plurality of resistors, and can suppress the relative error of the gradation voltages $V_0$ to $V_N$, likes the first embodiment.

Fourth Embodiment

Figure 14:
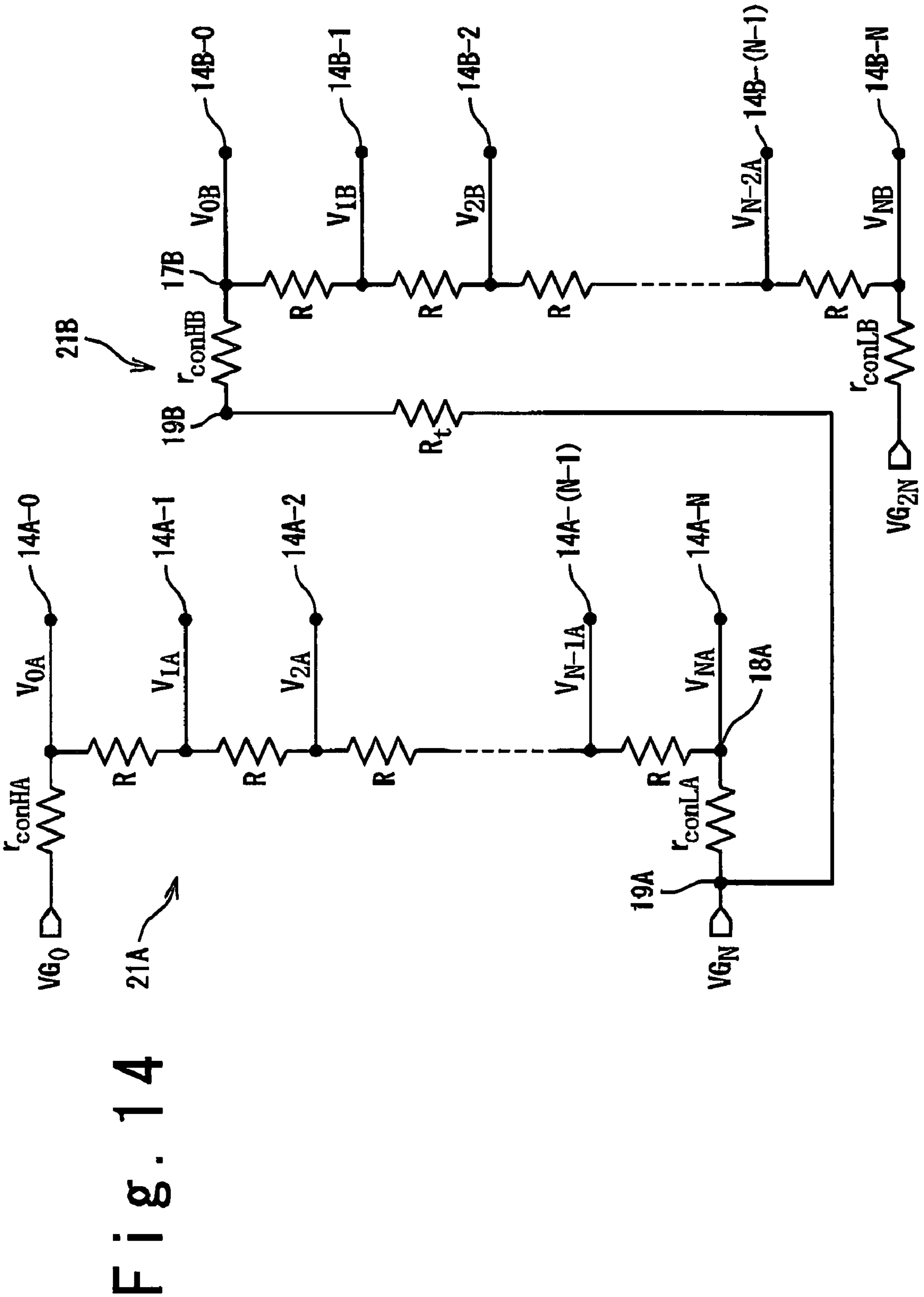
FIG. 14 shows an equivalent circuit of the resistor string in a fourth embodiment of the present invention.
Figure 15:
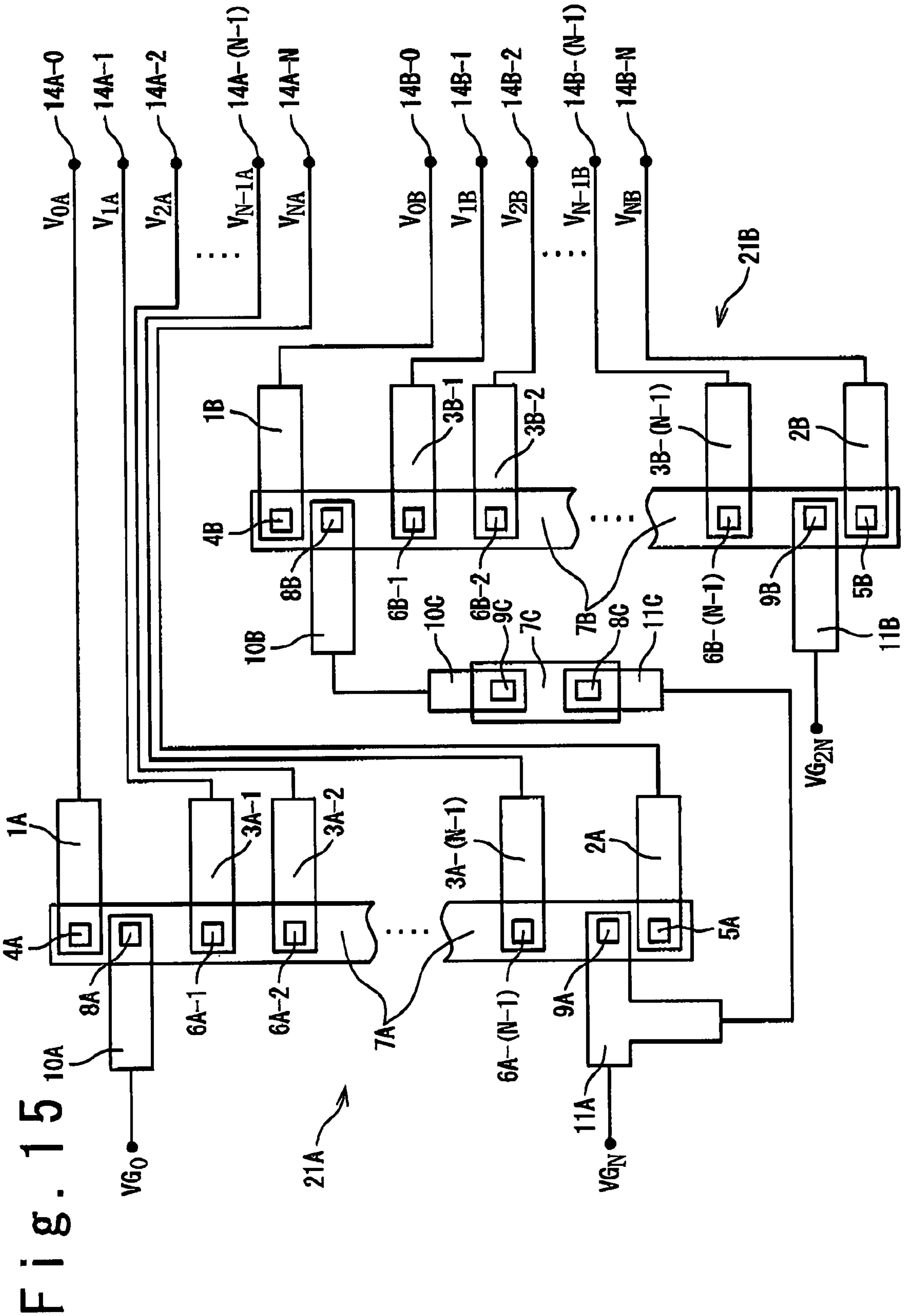
FIG. 15 is a plan view showing a layout pattern of the resistor string in the fourth embodiment.

Referring to FIGS. 14 and 15, the data driver with the resistor string 21 in a fourth embodiment will be described. In the fourth embodiment, a resistor string that has a plurality of resistor strings as in the first embodiment will be described.

FIG. 14 is an equivalent circuit diagram of the resistor string 21 in the fourth embodiment. Here, the two of a resistor string 21A and a resistor string 21B of which has the same configuration as that of the resistor string 21 in the first embodiment are connected in series. The same components as those in the first embodiment are allocated with the same reference numerals added with a symbol A or B. Moreover, the dummy resistor $r_{dum}$ and the contact resistances $r_{con0}$ to $r_{conN}$ are omitted (since a static current does not flow through the above contacts, so that the effect of the voltage drop due to the contact resistance can be neglected). Referring to FIG. 14, the reference voltages $VG_0$ and $VG_N$ are supplied into the resistor string 21A, and the gradation voltages $V_{0A}$ to $V_{NA}$ are supplied to nodes 14A-0 to 14A-N. The reference voltages $VG_N$ and $VG_2$% are supplied into the resistor string 21B, and the gradation voltages $V_{0B}$ to $V_{NB}$ are supplied to nodes 14B-1 to 14B-2N. The reference voltage $VG_N$ is supplied to the resistor string 21A through a node 19A. Moreover, the resistor string 21B has a node 19B connected with the node 19A and supplies the reference voltage $VG_N$ thereto. As shown in FIG. 14, a resistor $R_t$ may be provided between the node 19A and the node 19B, and the reference voltage whose voltage is dropped by the resistor $R_t$ may be supplied to the node 19B. Furthermore, the reference voltage $VG_N$ may be supplied not to the node 19A but to the node 19B. Moreover, the reference voltage $VG_N$ may be supplied to neither the node 19A nor the node 19B, but only the reference voltages $VG_0$ and $VG_{2N}$ may be supplied thereto. In that case, a static current flows through a path from a terminal to which the reference voltage $VG_0$ is supplied to a terminal to which the reference voltage $VG_{2N}$ is supplied through the resistor string 21A, the resistor $R_t$, and the resistor string 21B.

FIG. 15 shows a layout pattern of the resistor string 21 corresponding to the equivalent circuit shown in FIG. 12. Referring to FIG. 15, the resistor string 21 in the fourth embodiment has the resistor strings 21A and 21B whose layout patterns are the same as that of the first embodiment. The wiring 11A of the resistor string 21A and the wiring 10B of the resistor string 21B are connected through the resistor $R_t$. Specifically, contacts 8C and 9C are provided on a resistance element 7C so as to form the resistor $R_t$. The contact 8C is connected to the wiring 11A through a wiring 11C and the contact 9C is connected to the wiring 10B through a wiring 10C. That is, the reference voltage $VG_N$ supplied to the wiring 11A is supplied to the contact SB of the resistor string 21B via the resistor $R_t$ formed between the contact 8C and the contact 9C. In addition, the wiring 10C and the wiring 11C are formed to be separated from each other. Moreover, the wiring 11A and the wiring 11C may be the same wiring; the wiring 10B and the wiring 10C may be the same. A reference voltage $V_{2N}$ is supplied to the wiring 11B. Here, the reference voltage $V_{2N}$ is a value smaller than a reference voltage supplied to the wiring 10B.

With this configuration, in the resistor string 21A, the effects of the voltage drops due to the contact resistances $r_{conHA}$ and $r_{conLA}$ on the reference voltages act on the gradation voltage $V_{0A}$ to $V_{NA}$ equally, and suppress respective relative errors. Similarly, in the resistor string 21B, the effects of the voltage drops by the contact resistances $r_{conHB}$ and $r_{conLB}$ on the reference voltages act on the gradation voltages $V_{0B}$ to $V_{NB}$ equally, and suppress respective relative errors. That is, the relative errors of the gradation voltages in each of the resistor strings 21A and 21B is suppressed.

As described above, even in case that the plurality of resistor strings 21 are included, the present invention can suppress the relative errors of the gradation voltages in the each resistor string.

Fifth Embodiment

Figure 16:
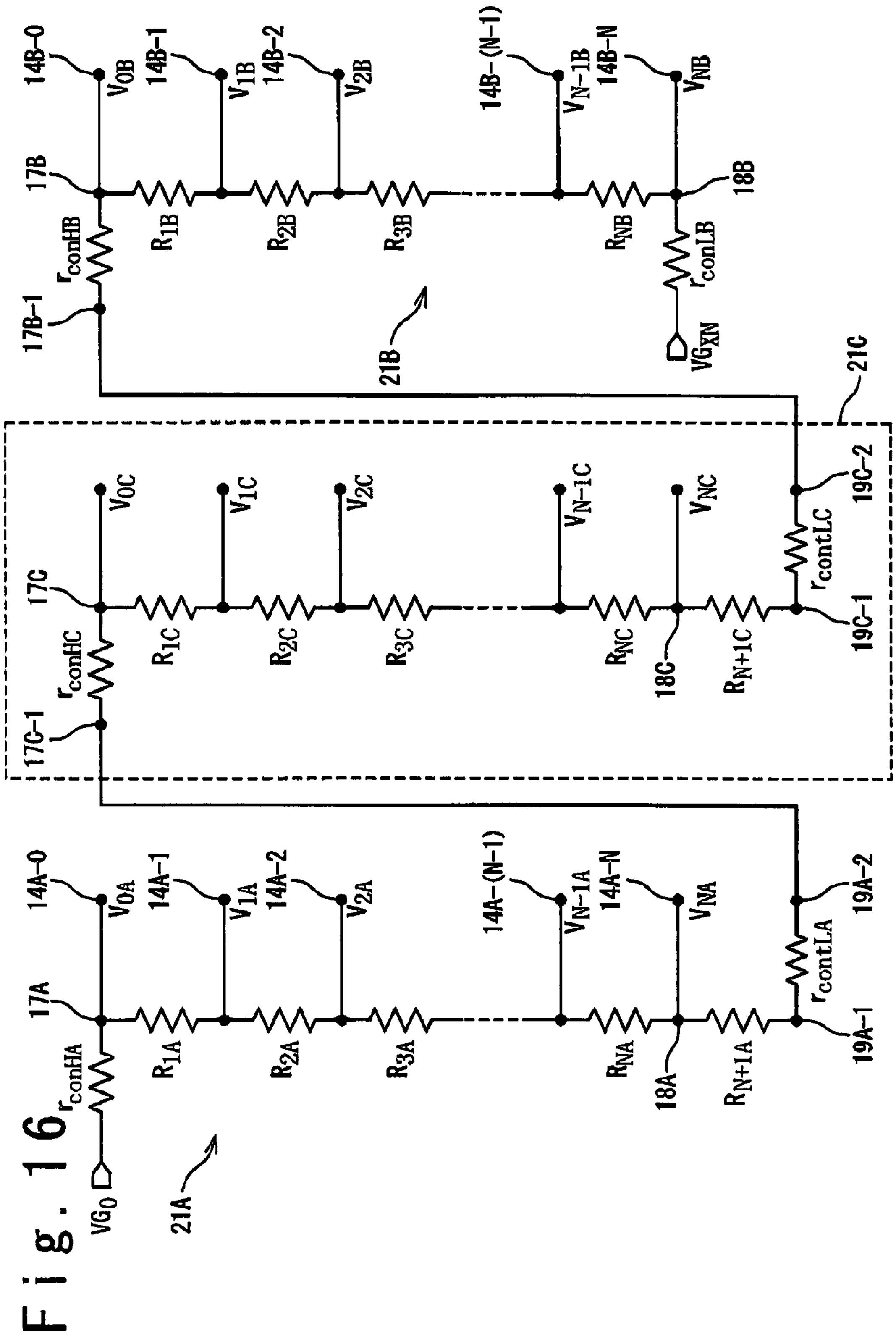
FIG. 16 shows an equivalent circuit of the resistor string in a fifth embodiment of the present invention.
Figure 17:
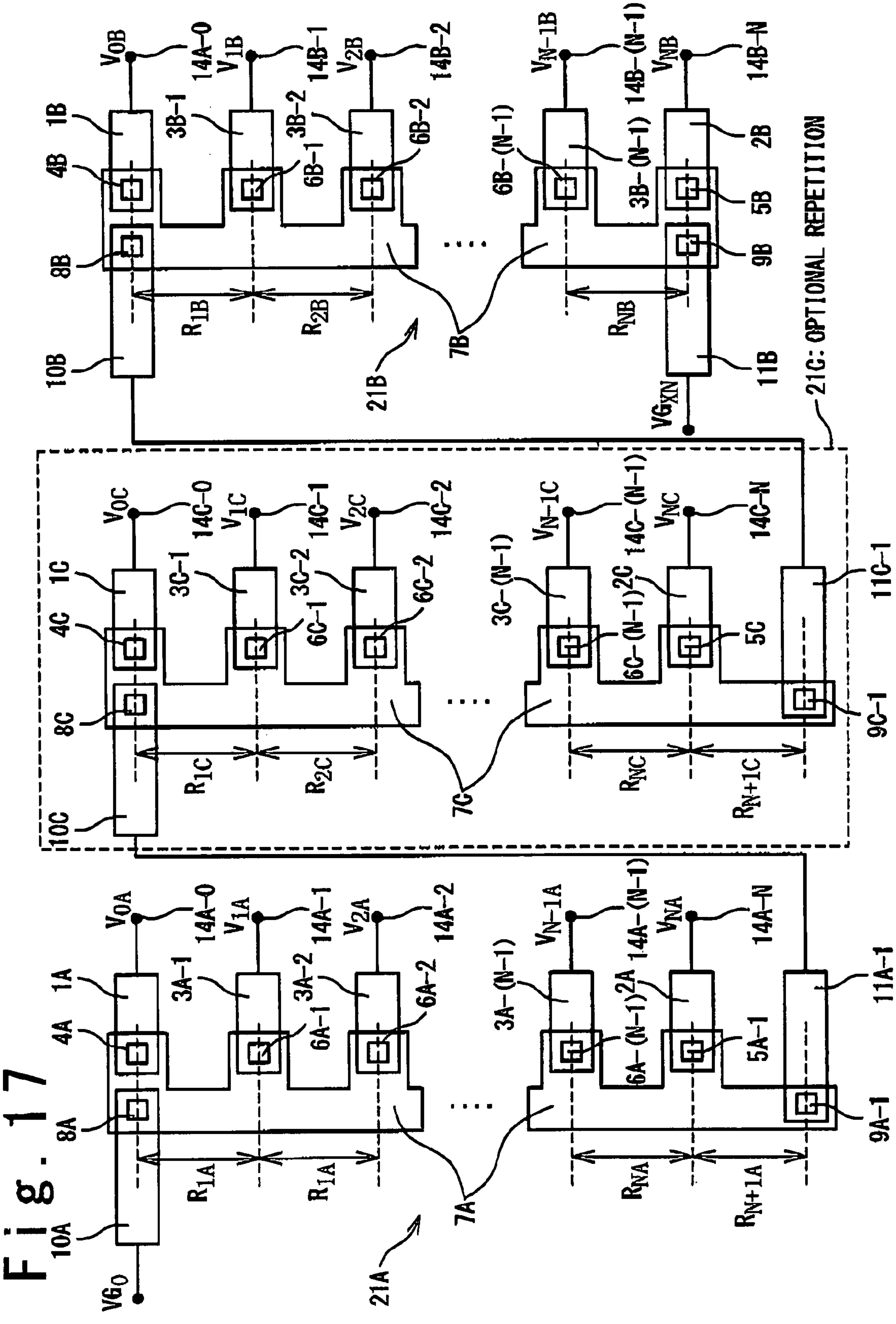
FIG. 17 is a plan view showing a layout pattern of the resistor string in the fifth embodiment.

Referring to FIGS. 16 and 17, the resistor string 21 according to the fifth embodiment will be described. In the fifth embodiment, a plurality of the resistor strings according to a modification of the first embodiment (FIGS. 5 and 6) are provided. Also, the fifth embodiment has a desirable configuration of the resistor string when the reference voltage $VG_N$ is not supplied and only the reference voltages $VG_0$ and $VG_{2N}$ are supplied, in the fourth embodiment (FIGS. 12 and 13). In the fourth embodiment shown in FIG. 13, a relative error can be restrained in the gradation voltages $V_{0A}$-$V_{NA}$ and gradation voltage $V_{0B}$-$V_{NB}$ for the resistor strings 21A and 21B. However, when the reference voltage $VG_N$ is not supplied and only the reference voltages $VG_0$ and $VG_{2N}$ are supplied, influence of the voltage drops of four contact resistances will be given since there are a contact 9A of the resistor string 21A, contacts 8C and 9C, and a contact 8B of the resistor string 21B on the current path in the connection section between the resistor strings 21A and 21B. Therefore, when there is a deviation of the contact resistance, there is a possibility that a relative error is caused on a voltage difference between the gradation voltages $V_{NA}$ and $V_{0B}$. In the fifth embodiment, a relative error can be restrained even when there is a voltage difference between the resistor strings.

FIG. 16 is an equivalent circuit diagram of the resistor string 21 in the fifth embodiment. Here, two resistor strings 21A and 21B which have configuration of the resistor string 21 in the modification of the first embodiment (FIGS. 5 and 6) are connected in series. Also, the same or similar components in FIGS. 5 and 6 are assigned with the same or similar reference numerals and distinguished by symbols A and B. Moreover, because the static current does not flow through a dummy resistance $r_{dum}$ and contact resistances $r_{con0}$-$r_{conN}$ so that the influence of the voltage drop can be ignored, the description is omitted. Referring to FIG. 16, the reference voltages $VG_0$ and $VG_{XN}$ are supplied to the resistor strings 21A and 21B, and the gradation voltages $V_{0A}$-$V_{NA}$ according to the above voltages are supplied to nodes 14A-0-14A-N from the resistor string 21A, and the gradation voltages $V_{0B}$-$V_{NB}$ are supplied to nodes 14B-1-14B-N from the resistor string 21B. It should be noted that although all the N resistors R of the resistor string are identical in FIGS. 5 and 6, the resistors may be different as described in the second embodiment. Therefore, in the fifth embodiment, it is supposed that the N resistors of the resistor string 21A are $R_{1A}$-$R_{NA}$ and the N resistors of the resistor string 21B are $R_{1B}$-$R_{NB}$. The resistor strings 21A and 21B are connected by a resistor $R_{(N+1)}$ which is added to the resistor string 21A. One end of the resistor $R_{(N+1)A}$ is connected to a node 18A and the other end of the resistor $R_{(N+1)A}$ is connected to a contact resistance $r_{cont1LA}$. The contact resistance $r_{cont1LA}$ of the resistor string 21A and a contact resistance $r_{contHB}$ (node 17B-1) of the resistor string 21B are connected by a wiring (metal wiring) so that the resistor strings 21A and 21B are connected with each other.

Also, another resistor string 21*c* may be interposed on the way of the wiring provided between the resistor strings 21A and 21B. In FIG. 16, the resistor string 21C is formed to have the same structure as the resistor string 21A, and the components are identified by allocating C to the components. A node 17C-1 of the contact resistance $r_{contHC}$ of the resistor string 21C is connected with a node 19A-2 of the contact resistance $r_{contLA}$ of the resistor string 21A through the wiring, and a node 19C-1 of the contact resistance $r_{contLC}$ of the resistor string 21C is connected with a node 17B-1 of the contact resistance $r_{contHB}$ of the resistor string 21B. A static current flows through a path from a terminal to which the reference voltage $VG_0$ is supplied to a terminal to which the reference voltage $VG_{XN}$ is supplied, through the resistor strings 21A, 21C and 21B. Any reference voltage is not supplied to the resistor string 21C, and the gradation voltages $V_{0C}$-$V_{NC}$ are supplied from the resistor string 21C to nodes 14C-0-14C-N. It should be noted that a plurality of the resistor strings 21C may be provided between the resistor strings 21A and 21B.

FIG. 17 shows a layout pattern of the resistor strings 21 corresponding to the equivalent circuit shown in FIG. 16. Referring to FIG. 17, each of the resistor strings 21 in the fifth embodiment includes the resistor string 21A or 21B having the layout pattern similar to that shown in FIG. 6. A difference point between the layout patterns of FIGS. 17 and 6 is in that although in FIG. 6, the contact 9 connected with the wiring 11 is arranged in the neighborhood of the contact 5 connected with the wiring 2, in FIG. 17, the contact 9A-1 connected with the wiring 11A-1 is arranged in a position where the resistance element 7A is extended by a resistance $R_{(N+1)A}$ from the neighborhood of the contact 5A connected with the wiring 2A. The wiring line 11A-1 of the resistor string 21A is connected with the wiring 10B of the resistor string 21B, so that the resistor strings 21A and 21B are connected. It is desirable that the wiring 11A-1 and 105 are identical to each other.

Also, the resistor string 21C may be arranged between the resistor string 21A and the resistor string 21B. In FIG. 17, the resistor string 21C has the same layout pattern as that of the resistor string 21A. In this case, the wiring 10C of the resistor string 21C is connected with the wiring line 11A-1 of the resistor string 21A and the wiring line 11C-1 is connected with the wiring line 10B of the resistor string 21B. It is desirable that the wiring 11A-1 and the wiring 10C are identical to each other, and the wiring 11C-1 and the wiring 10B are identical to each other.

In FIGS. 16 and 17, when the resistor strings 21A and 21B are connected, there are only the contact 9A-1 of the resistor string 21A and the contact 8B of the resistor string 21B on the current path of the static current in the connection section between the resistor strings 21A and 21B, resulting in reduction of voltage drop positions due to the contact resistances to two. Therefore, in this embodiment, the influence of the contact resistances between the resistor strings 21A and 21B becomes smaller than the case of the fourth embodiment (FIG. 13), and the relative error of the voltage difference between the gradation voltages $V_{NA}$ and $V_{0B}$ can be restrained. It should be noted that the resistor $R_{(N+1)A}$ of the resistor string 21A is formed on the resistance element 7 on which the resistors $R_{1A}$-$R_{NA}$ are formed. Therefore, a relative error between the gradation voltages generated through the resistance division by using the resistors $R_{1A}$-$R_{(N+1)A}$ becomes small. A voltage difference between the gradation voltage $V_{NA}$ of the resistor string 21A and the gradation voltage $V_{0B}$ of the resistor string 21A is set based on the resistor $R_{(N+1)A}$. It should be noted that the resistor $R_{(N+1)A}$ is divided into the resistors 7A and 7B and the resistors 7A and 7B may be connected through the contacts 9A-1 and 8B and the wiring 11A-1 (10B). Also, in case that the resistor string 21C is connected between the resistor strings 21A and 21B, the contact resistances through which the static current flows in the connection section between the resistor strings are only two. Therefore, a relative error of gradation voltages between the resistor strings can be restrained. It should be noted that a voltage difference between the gradation voltages $V_{NA}$ and $V_{0C}$ in the resistor strings 21A and 21*c* is set by the resistor $R_{(N+1)A}$, and a voltage difference between the gradation voltage $V_{NC}$ and $V_{0B}$ in the resistor strings 21C and 21B is set by the resistor $R_{(N+1)C}$. The resistors $R_{(N+1)A}$ and $R_{(N+1)C}$ may be divided and provided between two resistance elements.

As described above, the present invention can restrain the relative error between the gradation voltages and the relative error between gradation voltages in the resistor strings even when a plurality of resistor strings 21 are used.

According to the present invention, the relative errors among the gradation voltages due to the contact resistances can be suppressed by forming the contacts 5 and 6 to which the maximum ($V_0$) and the minimum ($V_N$) of the gradation voltage are supplied in an area that deviates from the current path of the static current I flowing through the resistor string 21. For this reason, when applying the present invention to the liquid crystal display apparatus, display unevenness of the display panel can be suppressed. Moreover, since the effects of the contact resistances on the gradation voltages are eliminated, it becomes possible to improve the yield. Furthermore, when applying the present invention to the liquid crystal display apparatus, there is a case that the reference voltage is modulated in response to a gamma characteristic of the liquid crystal panel. Even in such a case, a relative accuracy of the gradation voltages $V_1$ to $V_{N-1}$ is maintained.

In the foregoing, the embodiments of the present invention have been described in detail. Specific configurations are not restricted to the above-mentioned embodiments, and embodiments with modifications in a range that are not apart from a scope of the present invention may be included in the present invention. Although in the above-mentioned embodiments, the description is given assuming that the contact for taking out the gradation voltage is one and the contact to which the reference voltage is supplied is one (in the modification example, the number is two), a plurality of contacts may be provided for the former contact and/or for the latter contact. Moreover, although in the present embodiments, the description is given taking the gradation voltage generating circuit used for the liquid crystal display apparatus as one example, it is natural that the present invention can be used in the AD converter, the DA converter, and circuits such as a sensor using voltages of two or more levels.

Although the present invention has been described above in conjunction with several preferred embodiments thereof, it will be appreciated by those skilled in the art that those embodiments are provided solely for illustrating the invention, and should not be relied upon to construe the appended claims in a limiting sense.

What is claimed is:

1. A multilevel voltage generating circuit comprising:

a first resistance element;

a first input node provided on said first resistance element and supplied with a first reference voltage;

a second input node provided on said first resistance element and supplied with a second reference voltage, wherein a static current substantially flows in a first specific area for a line between said first and second input nodes on said first resistance element based on a difference between said first and second reference voltages; and a first group of output nodes provided for said first resistance element to output a portion of a plurality of level voltages based on said first and second reference voltages, wherein a first one of said first group of output nodes for one of said plurality of level voltages, which is closest to said first reference voltage, is separated from a direct connection with the first input node via the first resistance element, such that the first one of said first group of output nodes is provided in an area without any static current outside said first specific area.

2. The multilevel voltage generating circuit according to claim 1, wherein said first output node, said first input node, and said second input node, are arranged on a line on said first resistance element in this order.

3. The multilevel voltage generating circuit according to claim 1, wherein a second one of said first group of output nodes for one of said plurality of level voltages which is closest to said second reference voltage is provided in an area without any static current outside said first specific area.

4. The multilevel voltage generating circuit according to claim 1, wherein said first and second input nodes and said first group of output nodes are arranged such that a line passing through said first and second input nodes is different from a line passing through said first group of output nodes.

5. The multilevel voltage generating circuit according to claim 4, wherein each of said first group of output nodes has two node portions, and the line passing through said first and second input nodes passes between the two node portions of each of said first group of output nodes.

6. The multilevel voltage generating circuit according to claim 1, further comprising:

first and second conductors through which said first and second reference voltages are supplied to said first and second input nodes, respectively;

a third conductor connected with said first output node; and a plurality of fourth conductors connected with said first group of output nodes other than said first output node, respectively.

7. The multilevel voltage generating circuit according to claim 1, further comprising:

a second resistance element connected with said first resistance element;

a third input node provided on said second resistance element and supplied with said second reference voltage;

a fourth input node provided on said second resistance element and supplied with a third reference voltage, wherein a static current substantially flows in a second specific area for a line between said third and fourth input nodes on said second resistance element based on a difference between said second and third reference voltages; and a second group of output nodes provided for said second resistance element to output a portion of said plurality of level voltages based on said second and third reference voltages, wherein a second output node as one of said second group of output nodes for one of said second group of level voltages which is closest to said second or third reference voltage is provided in an area without any static current outside said second specific area.

8. The multilevel voltage generating circuit according to claim 7, further comprising:

a third resistance element provided between said first and second resistance elements, wherein said second reference voltage is supplied to said third input node through said third resistance element or said second reference voltage is supplied to said second input node through said third resistance element.

9. The multilevel voltage generating circuit according to claim 7, wherein said second output node, said third input node, and said fourth input node are arranged on a line on said second resistance element.

10. The multilevel voltage generating circuit according to claim 7, wherein said third and fourth input nodes and said second group of output nodes are arranged such that a line passing through said third and fourth input nodes is different from a line passing through said second group of output nodes.

11. The multilevel voltage generating circuit according to claim 1, wherein said first output node, said first input node, and said second input node, are arranged on a line on said first resistance element in this order, and wherein a second one of said first group of output nodes for one of said plurality of level voltages which is closest to said second reference voltage is provided in an area without any static current outside said first specific area.

12. A data driver comprising:

a multilevel voltage generating circuit;

a decoder configured to select at least one of a plurality of level voltages output from said multilevel voltage generating circuit based on an input digital data; and an amplifier configured to amplify the selected level voltage to output to one of data lines, wherein said multilevel voltage generating circuit comprises:

a first resistance element;

a first input node provided on said first resistance element and supplied with a first reference voltage;

a second input node provided on said first resistance element and supplied with a second reference voltage, wherein a static current substantially flows in a first specific area for a line between said first and second input nodes on said first resistance element based on a difference between said first and second reference voltages; and a first group of output nodes provided for said first resistance element to output a portion of a plurality of level voltages based on said first and second reference voltages, wherein a first one of said first group of output nodes for one of said plurality of level voltages, which is closest to said first reference voltage, is separated from a direct connection with the first input node via the first resistance element, such that the first one of said first group of output nodes is provided outside said first specific area.

13. The data driver according to claim 12, wherein said first output node, said first input node, and said second input node, are arranged on a line on said first resistance element in this order.

14. The data driver according to claim 12, wherein a second one of said first group of output nodes for one of said plurality of level voltages which is closest to said second reference voltage is provided in an area without any static current outside said first specific area.

15. The data driver according to claim 12, wherein said first and second input nodes and said first group of output nodes are arranged such that a line passing through said first and second input nodes is different from a line passing through said first group of output nodes.

16. The data driver according to claim 12, wherein said multilevel voltage generating circuit further comprises:

a second resistance element connected with said first resistance element;

a third input node provided on said second resistance element and supplied with said second reference voltage;

a fourth input node provided on said second resistance element and supplied with a third reference voltage, wherein a static current substantially flows in a second specific area for a line between said third and fourth input nodes on said second resistance element based on a difference between said second and third reference voltages; and a second group of output nodes provided for said second resistance element to output a portion of said plurality of level voltages based on said second and third reference voltages, wherein a second output node as one of said second group of output nodes for one of said second group of level voltages which is closest to said second or third reference voltage is provided outside said second specific area.

17. The data driver according to claim 16, wherein said multilevel voltage generating circuit further comprises:

a third resistance element provided between said first and second resistance elements, and wherein said second reference voltage is supplied to said third input node through said third resistance element.

18. The data driver according to claim 16, wherein said second output node, said third input node, and said fourth input node are arranged on a line on said second resistance element or said second reference voltage is supplied to said second input node through said second resistance element.

19. The data driver according to claim 16, wherein said third and fourth input nodes and said second group of output nodes are arranged such that a line passing through said third and fourth input nodes is different from a line passing through said second group of output nodes.

20. A liquid crystal display apparatus comprising:

a display panel which includes pixels provided in intersections of a plurality of data lines and a plurality of scanning lines;

a gate driver configured to drive said scanning lines; and a data driver configured to drive said data lines, wherein said data driver comprises:

a multilevel voltage generating circuit;

a decoder configured to select at least one of a plurality of level voltages output from said multilevel voltage generating circuit based on an input digital data; and an amplifier configured to amplify the selected level voltage to output to one of said data lines, wherein said multilevel voltage generating circuit comprises:

a first resistance element;

a first input node provided on said first resistance element and supplied with a first reference voltage;

a second input node provided on said first resistance element and supplied with a second reference voltage, wherein a static current substantially flows in a first specific area for a line between said first and second input nodes on said first resistance element based on a difference between said first and second reference voltages; and a first group of output nodes provided for said first resistance element to output a portion of a plurality of level voltages based on said first and second reference voltages, wherein a first one of said first group of output nodes for one of said plurality of level voltages, which is closest to said first reference voltage, is separated from a direct connection with the first input node via the first resistance element, such that the first one of said first group of output nodes is provided in an area without any static current outside said first specific area.

21. The liquid crystal display apparatus according to claim 20, wherein said multilevel voltage generating circuit further comprises:

a second resistance element connected with said first resistance element;

a third input node provided on said second resistance element and supplied with said second reference voltage;

a fourth input node provided on said second resistance element and supplied with a third reference voltage, wherein a static current substantially flows in a second specific area for a line between said third and fourth input nodes on said second resistance element based on a difference between said second and third reference voltages; and a second group of output nodes provided for said second resistance element to output a portion of said plurality of level voltages based on said second and third reference voltages, wherein a second output node as one of said second group of output nodes for one of said second group of level voltages which is closest to said second or third reference voltage is provided in an area without any static current outside said second specific area.

22. The liquid crystal display apparatus according to claim 21, wherein said multilevel voltage generating circuit further comprises:

a third resistance element provided between said first and second resistance elements, wherein said second reference voltage is supplied to said third input node through said third resistance element as said third reference voltage or said second reference voltage is supplied to said second input node through said third resistance element.

23. A multilevel voltage generating circuit which generates a plurality of level voltages based on first and second reference voltages supplied thereto, comprising:

first and second resistance elements;

a first conductor supplied with said first reference voltage;

a second conductor supplied with said second reference voltage;

third and fourth conductors provided between said first and second conductors;

fifth to seventh conductors from which first to third level voltages of said plurality of level voltages are outputted, respectively;

a first connection section connecting between said first conductor and said first resistance element;

a second connection section connecting said second conductor and said second resistance element;

a third connection section connecting said third conductor and said first resistance element:

a fourth connection section connecting said fourth conductor and said second resistance element;

fifth and sixth connection sections connecting said fifth and sixth conductors and said first resistance element, respectively; and a seventh connection section connecting said seventh conductor and said second resistance element, wherein said first to third and fifth to seventh conductors are separated from each other, a first resistance region between said fifth connection section and said first connection section, a second resistance region between said first connection section and said third connection section, and a third resistance region between said third connection section and said sixth connection section are formed in series with said first resistance element, wherein a fourth resistance region between said fourth connection section and said second connection section, and a fifth resistance region between said fourth connection section and said seventh connection section are formed in series are with said second resistance element, and wherein one of the fifth to seventh conductors, which is closest to the first reference voltage, is separated from a direct connection with the first conductor via the first resistance element or the second resistance element.

24. The multilevel voltage generating circuit according to claim 23, wherein said fourth conductor and said third conductor are a same.

25. The multilevel voltage generating circuit according to claim 23, further comprising;

a third resistance element being provided between said third conductor and said fourth conductor;

an eighth conductor from which a fourth level voltage of said plurality of level voltages is outputted;

an eighth connection section connecting said third conductor and said third resistance element;

a ninth connection section connecting said fourth conductor and said third resistance element; and a tenth connection section connecting said eighth conductor and said third resistance element, wherein said third conductor, said fourth conductor and said eighth conductor are separated from each other, wherein a sixth resistance region between said eighth connection section and said ninth connection section and a seventh resistance region between said ninth connection section and said tenth connection section are formed in series with said third resistance element.

* * * * *